(12) United States Patent  
Kushta

(10) Patent No.: US 9,362,603 B2  
(45) Date of Patent: Jun. 7, 2016

(54) VIA STRUCTURES AND COMPACT THREE-DIMENSIONAL FILTERS WITH THE EXTENDED LOW NOISE OUT-OF-BAND AREA

(75) Inventor: Taras Kushta, Tokyo (JP)

(73) Assignee: NEC CORPORATION, Tokyo (JP)

( * ) Notice: Subject to any disclaimer, the term of this patent is extended or adjusted under 35 U.S.C. 154(b) by 512 days.

(21) Appl. No.: 13/806,824

(22) PCT Filed: Jun. 30, 2010

(86) PCT No.: PCT/JP2010/004313  
§ 371 (c)(1),  
(2), (4) Date: Dec. 24, 2012

(87) PCT Pub. No.: WO2012/001742  
PCT Pub. Date: Jan. 5, 2012

(65) Prior Publication Data  
US 2013/0099876 A1  Apr. 25, 2013

(51) Int. Cl.
| | | |
|---|---|---|
| H01P 1/203 | (2006.01) | |
| H01P 1/20 | (2006.01) | |
| H05K 1/02 | (2006.01) | |
| H05K 3/42 | (2006.01) | |
| H05K 3/46 | (2006.01) | |

(52) U.S. Cl.  
CPC *H01P 1/20* (2013.01); *H01P 1/203* (2013.01); *H05K 1/0233* (2013.01); *H05K 1/0222* (2013.01); *H05K 1/0251* (2013.01); *H05K 3/429* (2013.01); *H05K 3/4614* (2013.01); *H05K 2201/0979* (2013.01); *H05K 2201/09609* (2013.01); *H05K 2201/09618* (2013.01)

(58) Field of Classification Search  
CPC ........... H01P 1/203; H01P 1/205; H01P 3/08; H01P 7/08  
USPC ......... 333/204, 205, 206, 207, 219, 235, 246; 24/204, 205, 206, 207, 219, 235, 246  
See application file for complete search history.

(56) References Cited

U.S. PATENT DOCUMENTS

| 7,705,695 B2 | 4/2010 | Kushta |
|---|---|---|
| 8,013,685 B2 | 9/2011 | Kushta et al. |

(Continued)

FOREIGN PATENT DOCUMENTS

| JP | 2007-158675 | 6/2007 |
|---|---|---|
| JP | 2009-528693 | 8/2009 |

(Continued)

OTHER PUBLICATIONS

International Search Report (ISR) (PCT Form PCT/ISA/210) dated Oct. 5, 2010, in PCT/JP2010/004313.

*Primary Examiner* — Robert Pascal  
*Assistant Examiner* — Gerald Stevens  
(74) *Attorney, Agent, or Firm* — McGinn IP Law Group, PLLC.

(57) ABSTRACT

A filter of the present invention includes a plurality of via structures with a multilayer substrate. Each of the plurality of via structures includes first, second and third functional sections. One end of a signal via of the first functional section is connected to one end of a signal via of the second functional section and another end of the signal via of the second functional section is connected to two signal vias of the third functional section. Those signal vias are surrounded by a plurality of ground vias. Input and output ports of the filter are connected to another end of the signal via of each first functional section.

18 Claims, 40 Drawing Sheets

(56) References Cited

U.S. PATENT DOCUMENTS

| | | | |
|---|---|---|---|
| 8,085,112 B2 | 12/2011 | Kushta et al. | |
| 2010/0039189 A1* | 2/2010 | Taniguchi | 333/185 |
| 2010/0265011 A1* | 10/2010 | Ding et al. | 333/204 |

FOREIGN PATENT DOCUMENTS

| | | |
|---|---|---|
| JP | 2009-206495 | 9/2009 |
| JP | 4367660 | 11/2009 |

* cited by examiner

VIA STRUCTURES AND COMPACT THREE-DIMENSIONAL FILTERS WITH THE EXTENDED LOW NOISE OUT-OF-BAND AREA

TECHNICAL FIELD

The present invention relates to via structures and filters based on multilayer substrate technologies.

BACKGROUND ART

Filtering components are one of key elements in modern and next-generation networking and computing equipment because they are responsible for controlling the frequency responses. For practical applications, it is important to obtain such structures as compact, cost-effective and low energy consuming devices. Also, filters have to be easily integrated in a system.

Multilayer substrates are low-cost interconnect technologies. That is why they are used as the basis of chip, package and printed circuit board constructions forming networking and computing systems.

Transmission lines in multilayer substrates can be implemented as horizontal and vertical wave guiding structures.

Microstrip lines, striplines, parallel plate lines and coplanar waveguides are some typical representatives of planar (horizontal) transmission lines.

At the same time, shield vias, formed by signal and ground vias conjointly as specific coaxial waveguides, represent vertical transmission lines.

Horizontal and vertical wave guiding structures in multilayer substrates are also used to develop distributed passive components, including filters.

In this case, the application of horizontal and vertical transmission lines gives a possibility to obtain a compact three-dimensional (3-D) architecture of filters.

Japanese Patent 4367660 (U.S. Pat. No. 7,705,695) discloses composite via structures, which can be appropriately connected by a planar transmission line to provide a 3-D miniaturized filter.

However, there are crucial problems in filter design, namely suppressions of unwanted resonant modes in the out-of-band area.

Also, it is very important to improve sharpness of transverse dimensions.

CITATION LIST

Patent Literature

[PTL 1]
Japanese Patent No. 4367660 (US 2008/0093112A1)

SUMMARY OF INVENTION

It is an object of the present invention to provide compact filters in multilayer substrates with improved suppression of undesirable resonant mode in the out-of-band area.

It is another object of this invention to improve the filter skirt or sharpness of filter characteristics in a manner keeping filter size.

A filter of the present invention includes: a plurality of via structures; a transmission line configured to connect the plurality of via structures; and a plurality of signal ports configured to input or output signals. Each of the plurality of via structures includes: a multilayer substrate with a plurality of stacked conductor layers and a dielectric isolating each of the plurality of stacked conductor layers; a first functional section disposed at one side of the multilayer substrate; a second functional section connected to the first functional section; and a third functional section connected to the second functional section and disposed at a side of the multilayer substrate opposite to the side of the first functional section. The first functional section includes: a first pad embedded in a top conductor layer of the plurality of stacked conductor layers; a connection pad embedded in one of the plurality of conductor layers and configured to connect to the second functional section; a first signal via with one end connected to the first pad and another end connected to the connection pad; a first plurality of ground vias surrounding the first signal via; a first plurality of ground plates embedded in the plurality of conductor layers and connected to the first plurality of ground vias; and a first clearance region embedded in the dielectric configured to isolate the first pad, the connection pad and the first signal via from the first plurality of ground vias and the first plurality of ground plates. The second functional section includes: a connection plate embedded in one of the plurality of conductor layers and configured to connect to the third functional section; a second signal via with one end connected to the connection pad and another end connected to the connection plate; a second plurality of ground vias surrounding the second signal via; a second plurality of ground planes embedded in the plurality of conductor layers and connected to the second plurality of ground vias; and a second clearance region embedded in the dielectric and configured to isolate the connection plate and the second signal via from the second plurality of ground vias and the second plurality of ground planes. The third functional section includes: two identical third signal vias connected to the connection plate by one end; two identical sets of conductive plates respectively connected to the two identical signal vias; a third plurality of ground vias surrounding the two identical signal vias; a third plurality of ground planes connected to said third plurality of ground vias; and a third clearance region embedded in the dielectric and configured to isolate the two identical third signal vias and two identical sets of conductive plates from the third plurality of ground vias and the third plurality of ground planes. The transmission line is connected to the connection pad of the each via structure. The plurality of signal ports are connected to or embedded in the first pad of the each via structure.

DESCRIPTION OF EMBODIMENTS

Figure 1A:
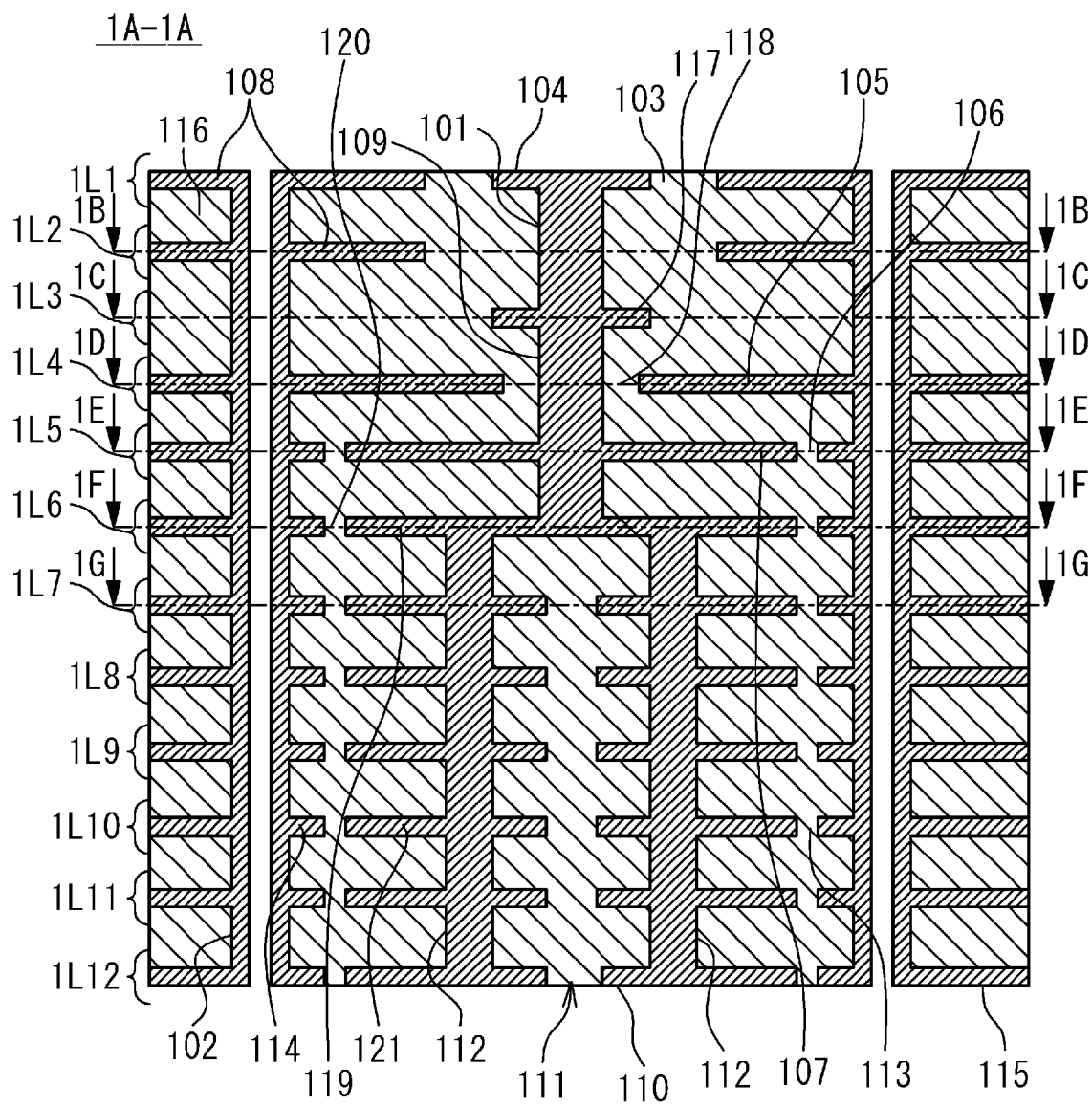
FIG. 1A is a vertical cross-sectional view illustrating a via structure in an exemplary embodiment of the present invention.
Figure 1B:
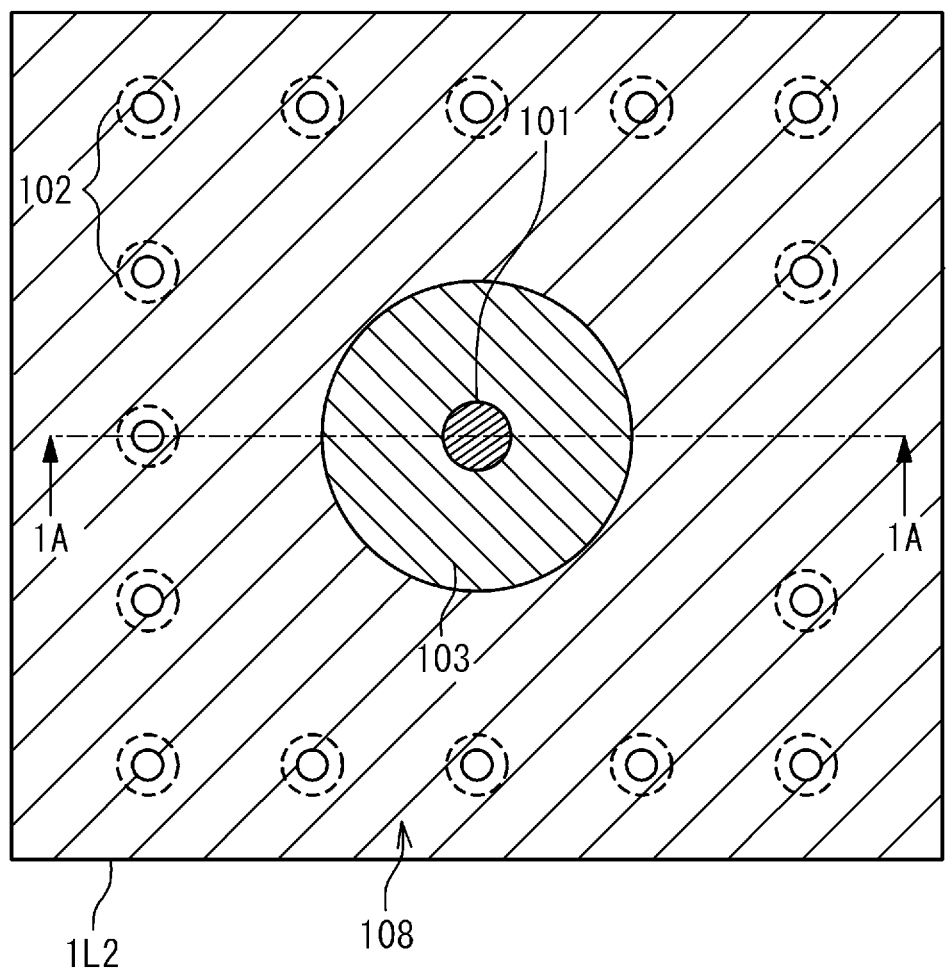
FIG. 1B is a horizontal cross-sectional view of the via structure shown in FIG. 1A on the 1B section.
Figure 1C:
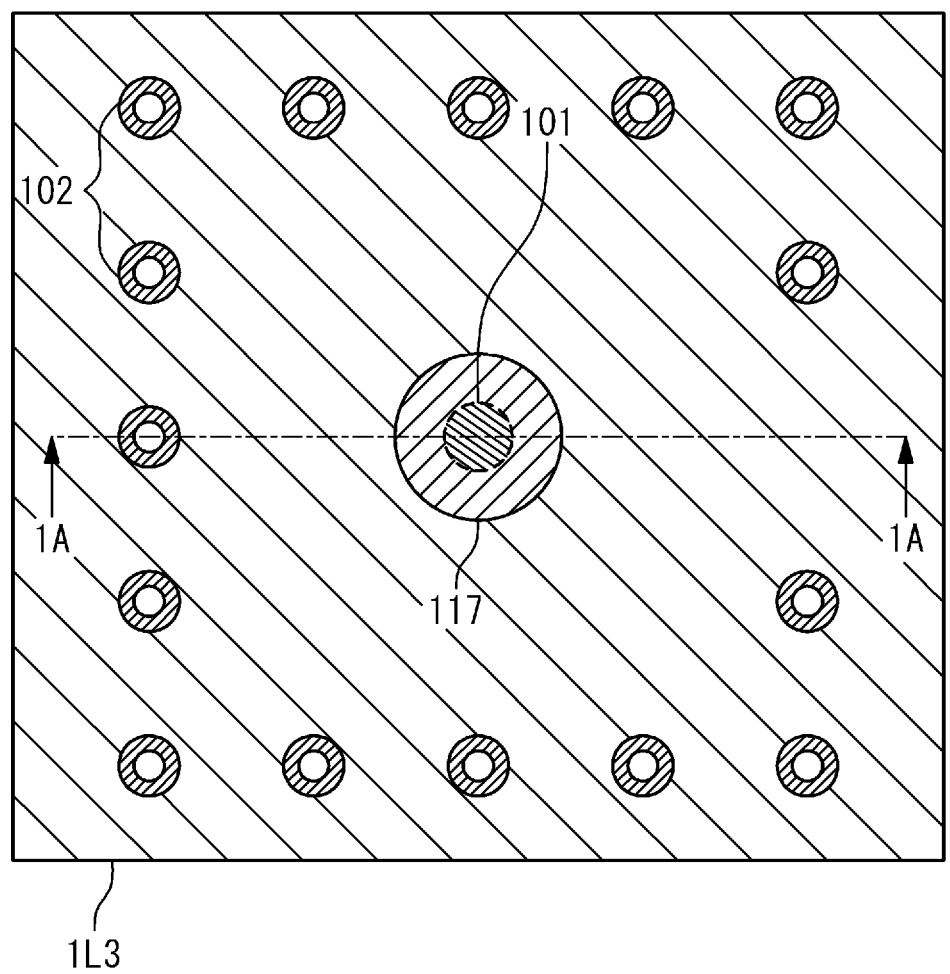
FIG. 1C is a horizontal cross-sectional view of the via structure shown in FIG. 1A on the 1C section.
Figure 1D:
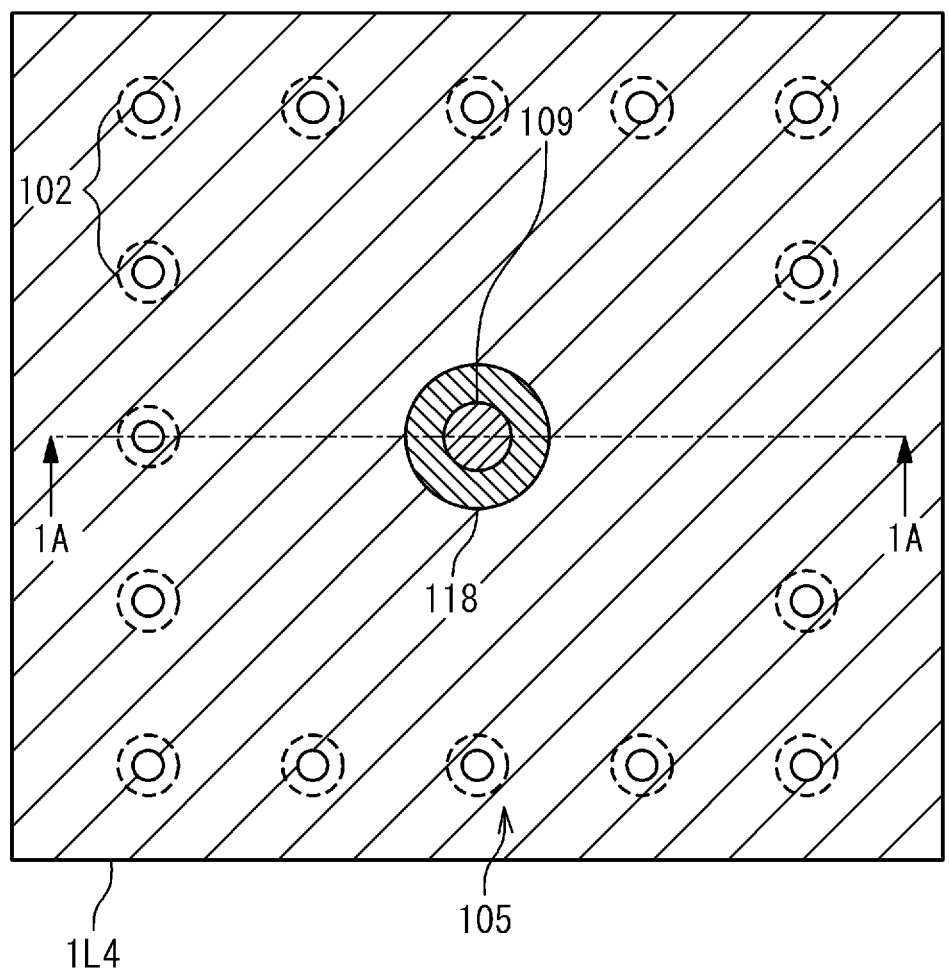
FIG. 1D is a horizontal cross-sectional view of the via structure shown in FIG. 1A on the 1D section.
Figure 1E:
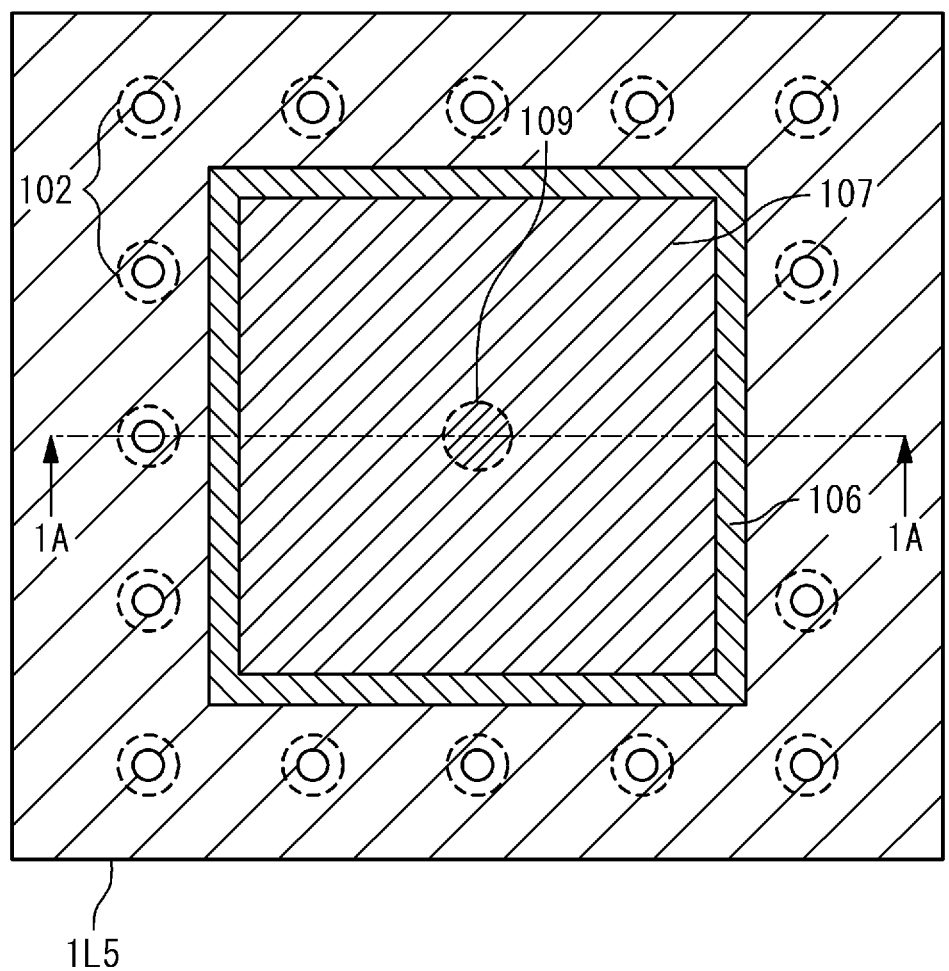
FIG. 1E is a horizontal cross-sectional view of the via structure shown in FIG. 1A on the 1E section.
Figure 1F:
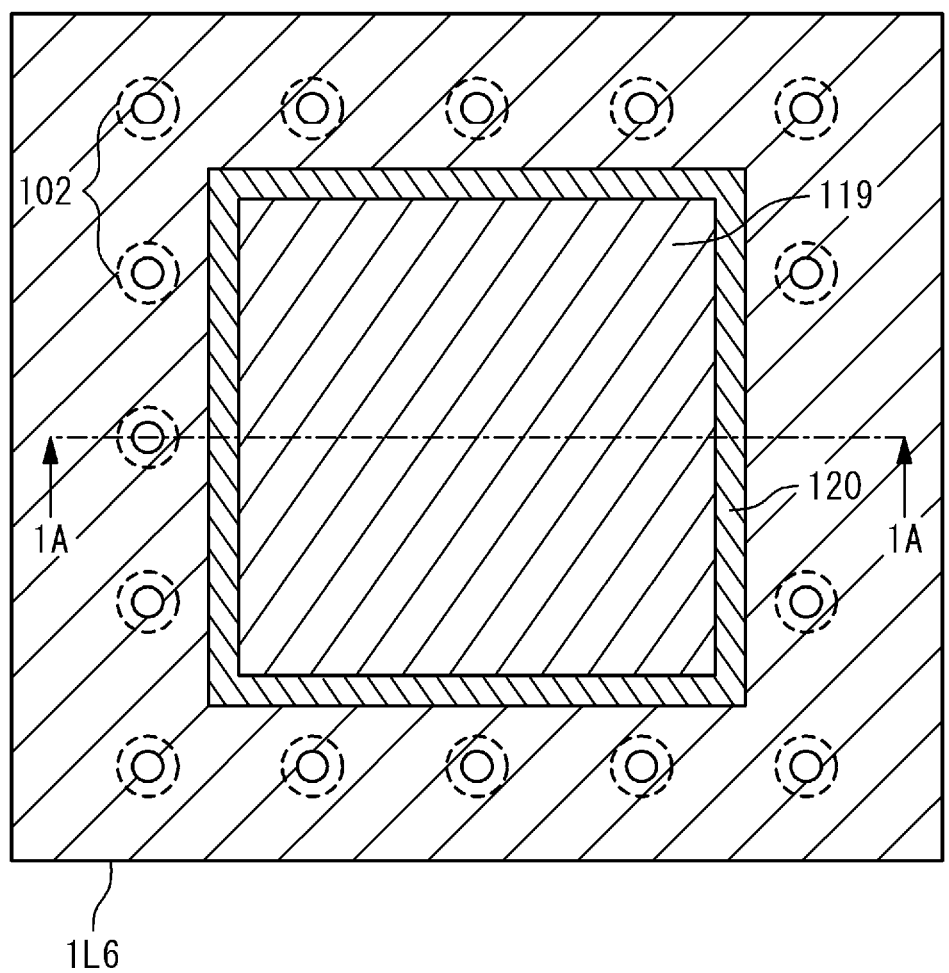
FIG. 1F is a horizontal cross-sectional view of the via structure shown in FIG. 1A on the 1F section.
Figure 1G:
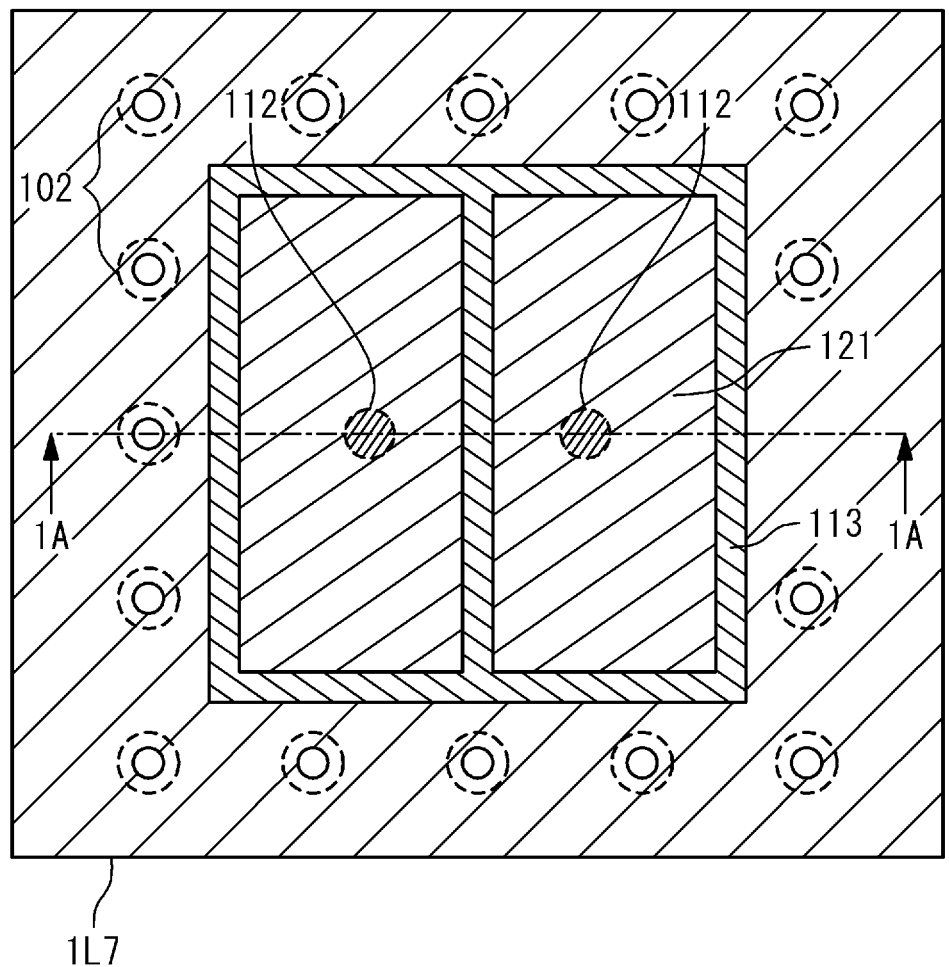
FIG. 1G is a horizontal cross-sectional view of the via structure shown in FIG. 1A on the 1G section.
Figure 1H:
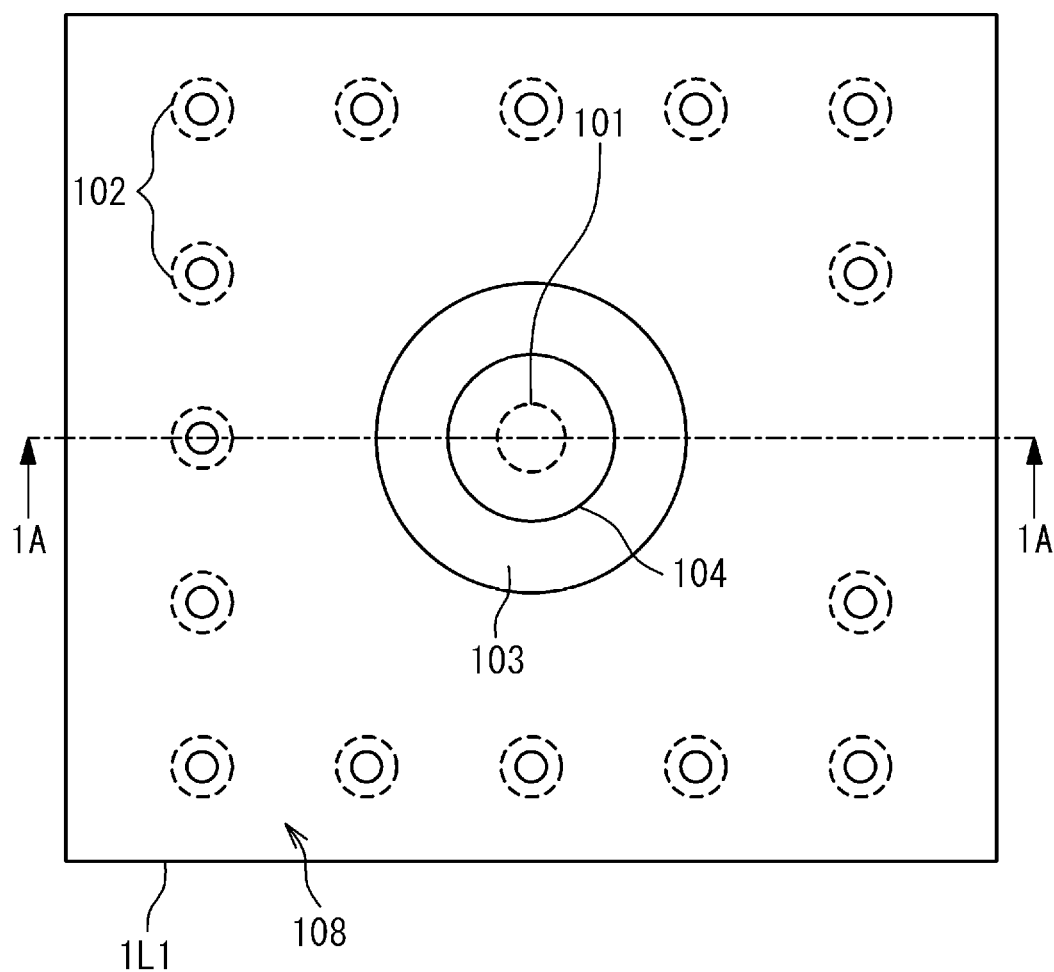
FIG. 1H is a top view of the via structure shown in FIG. 1A.
Figure 1I:
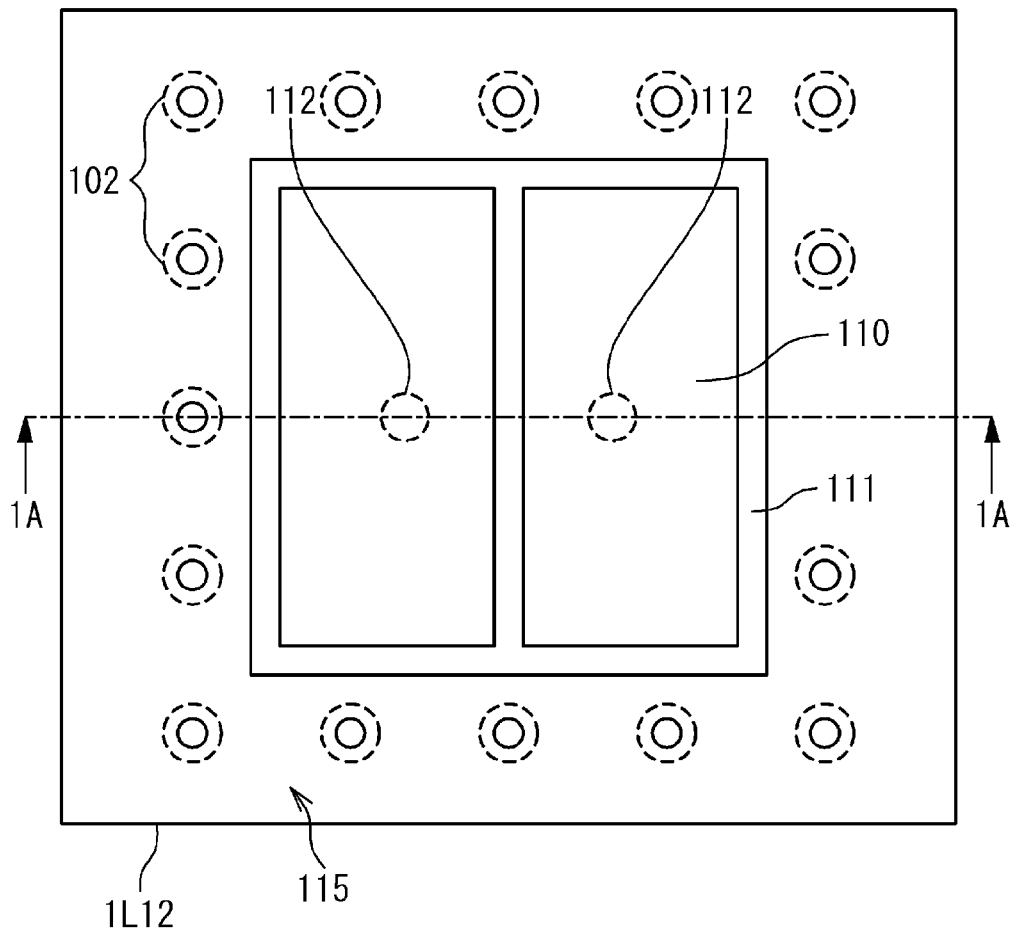
FIG. 1I is a bottom view of the via structure shown in FIG. 1A.

Hereinafter, several embodiments of via structures and filters disposed in multilayer substrates according to the present invention will be described in details with reference to attached drawings. But, it would be well understood that this description should not be viewed as narrowing the appended claims.

In FIGS. 1A to 1I, an exemplary embodiment of a via structure in a twelve-conductor-layer substrate of the present invention is shown.

It should be noted that this twelve-conductor-layer substrate is only an example of multilayer substrates and a number of conductor layers, filling material and other substrate parameters can be different that depends on applications.

The multilayer substrate shown in FIGS. 1A to 1I is provided with twelve stacked conductor layers 1L1, 1L2, 1L3, 1L4, 1L5, 1L6, 1L7, 1L8, 1L9, 1L10, 1L11 and 1L12, and those twelve conductor layers are isolated by a dielectric 116.

In present embodiment, the via structure has three functional sections.

The first functional section includes a first pad 104, a connection pad 117, a signal via 101, ground vias 102, ground plates 108 and a clearance area 103. The first pad 104 is disposed in the first layer 1L1 and on one side of the substrate. The connection pad 117 is disposed in the third layer 1L3. The signal via 101 is disposed between the first and the third layers 1L1 and 1L3 and connected to the first pad 104 in one hand and connection pad 117 in the other hand. The ground vias 102 are disposed between the first and the last layers 1L1 and 1L12 and surrounding the signal via 101. The ground plates 108 are disposed in the first and second layers 1L1 and 1L2 and connected to the ground vias 102. The clearance area 103 is disposed between the first and the third layers 1L1 and 1L3 and isolates the first pad 104, the connection pad 117 and the signal via 101 from ground conductors. In this first functional section, the first pad 104 and the connection pad 117 are used as input or output ports of a signal. Note that ground vias are arranged according to a square contour as an example of a possible ground via arrangement. The clearance area 103 can be considered as a first clearance region. The first pad 104, the connection pad 117 and the ground plates 108 are embedded in the conductor layers.

The second functional section has a signal via 109, ground vias 102, ground plates 105, a conductive plate 107, an isolating slits 106 and 120, a connection plate 109 and a clearance area 118. The signal via 109 is disposed between the third and the sixth layers 1L3 and 1L6 and jointed to the connection pad 117. The ground plates 105 is disposed in the fourth layer 1L4 and connected to the ground vias 102. The conductive plate 107 is disposed in the fifth layer 1L5 and connected to the signal via 109. The isolating slit 106 is disposed in the fifth layer 1L5 and separates the conductive plate 107 from ground conductors. The connection plate 119 is disposed in the sixth layer 1L6 and jointed to the signal via 109. The isolating slit 120 is disposed in the sixth layer 1L6 and separates the connection plate 119 from ground conductors. The clearance area 118 is disposed in the fourth layer 1L4 and separates the signal via 109 from ground conductors. The isolating slits 106 and 120 and the clearance area 118 can be considered as a second clearance region. The ground plates 105, the conductive plate 107 and the connection plate 109 are embedded in the conductor layers.

The third functional section includes two identical signal vias 112, ground vias 102, ground plates 114, two sets of conductive plates 121, an isolating slits 113 and 111 and two border plates 110. The signal vias 112 is disposed between the sixth and the last layers 1L6 and 1L12 and jointed to the connection plate 119. The ground vias 102 are disposed between the sixth and the last layers 1L6 and 1L12 and surrounding the two signal vias 112. The ground plates 114 are disposed in 5 layers 1L7 to 1L11 and connected to ground vias 102. One of the two sets of conductive plates 121 is connected to one signal via 112 and another set is connected to another signal via 112. The isolating slit 113 separates the two sets of conductive plates 121 from each other and from ground conductors. The two border plates 110 are disposed on another side of the substrate in which each border plate is connected respectively to each signal via 112. The isolating slit 111 separates two border plates 110 from each other and from ground conductors disposed on this conductor layer. The isolating slits 113 and 111 can be considered as a third clearance region. The ground plates 114, the two sets of conductive plates 121 and two border plates 110 are embedded in the conductor layers.

Thus in the vertical direction, the first functional section is extended from the first pad 104 to the connection pad 117 (including these pads), the second functional section covers the region from the connection pad 117 to the connection plate 119 (including connection plate 119), and the third functional section is extended from the connection plate 119 to the border plate 110 (including the border plate 110).

The meaning of each functional section is as following.

The first functional section serves to provide well-matched signal propagation from the first pad 104 to the connection pad 117. This feature is achieved by controlling transverse dimensions of the signal via 101, first pad 104, connection pad 117 and clearance area 103, as well as the distance between signal and ground vias 101 and 102.

The second functional section is assigned as a vertical transmission line segment with predefined parameters as characteristic impedance and propagation constant. These parameters are obtained by controlling dimensions of the conductive plate 107 connected to the signal via 109, the diameter of the signal via 109 and the distance from the signal via 109 to the ground vias 102.

The third functional section is formed to provide a parallel coupled-line section arranged in the vertical direction. Each line in this section can be characterized by the characteristic impedance and propagation constant which can be regulated by dimensions of conductive plates 121 connected to the signal vias 112, the diameter of the signal vias 112, the distance between the signal vias 112 and the distance between the signal vias 112 and ground vias 102.

This third functional section is used to obtain additional transmission zeros and, in such way, to reduce unwanted resonant modes in the out-of-band area and to improve the filter skirt in the in-band area.

Figure 1J:
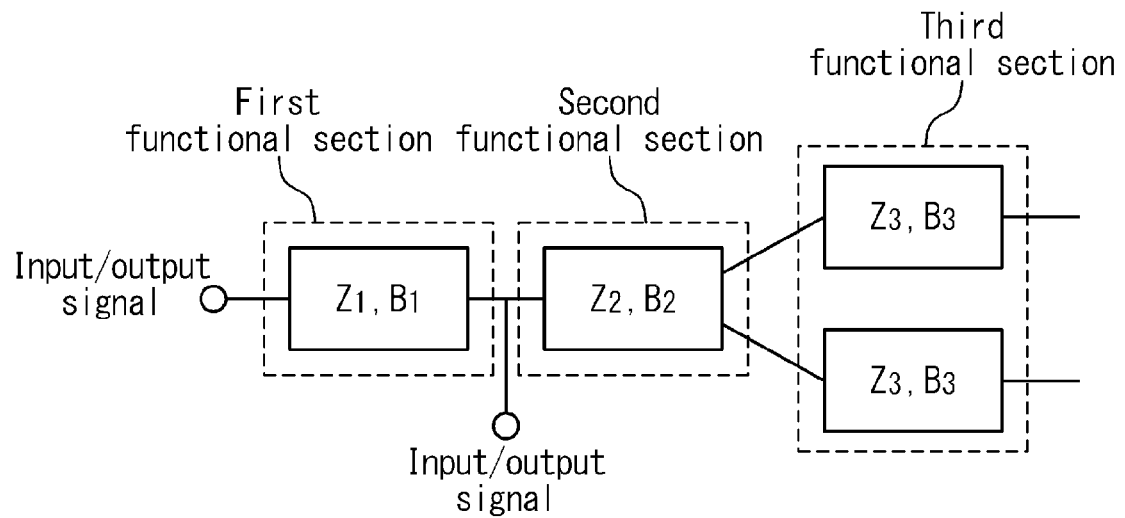
FIG. 1J is a simplified block diagram of the via structure shown in FIGS. 1A to 1I.

In FIG. 1J a simplified block diagram of the via structure is shown. In this block diagram there are one block corresponding to the first functional section, another block corresponding to the second functional section and two further other blocks respectively corresponding to the two paths of the third functional section. The block corresponding to the first functional section is connected to a input or output port of a signal in one hand and is connected to another input or output port of a signal and the block corresponding to the second function section in the other hand. The block corresponding to the second function section is connected to the block corresponding to the first functional section and the another signal input/output section in one hand and is connected to the two blocks respectively corresponding to the two paths of the third functional section. In this diagram, the first functional section is represented by a block with a characteristic impedance $Z_1$ and a propagation constant $B_1$, the second functional section is represented by a block with a characteristic impedance $Z_2$ and a propagation constant $B_2$ and the third functional section is represented by the two blocks both with a characteristic impedance $Z_3$ and a propagation constant $B_3$.

In FIGS. 2A to 2I, another exemplary embodiment of a via structure in a ten-conductor-layer substrate is shown.

The multilayer substrate shown in FIGS. 2A to 2I is provided with ten stacked conductor layers 2L1, 2L2, 2L3, 2L4, 2L5, 2L6, 2L7, 2L8, 2L9, and 2L10, and those conductor layers are isolated by a dielectric 216.

In shown embodiment, the via structure has three functional sections.

The first functional section includes a first pad 204, a connection pad 217, a signal via 201, ground vias 202, ground plates 208 and a clearance area 203. The first pad 204 is disposed on one side of the substrate. The signal via 201 is connected to the first pad 204 and connection pad 217. The ground vias 202 are surrounding the signal via 201. The ground plates 208 are connected to the ground vias 202. The clearance area 203 is isolating the first pad 204, the connection pad 217 and the signal via 201 from ground conductors. In this functional section the first pad 204 and the connection pad 217 are used as input or output ports of a signal. The clearance area 203 can be considered as a first clearance region. The first pad 204, the connection pad 217 and the ground plates 208 are embedded in the conductor layers.

The second functional section has a signal via 209, ground vias 202, ground plates 205, conductive plates 207, isolating slits 206 and 220, a connection plate 219 and a clearance area 218. The signal via 209 is jointed to the connection pad 217. The ground plates 205 are connected to the ground vias 202. The conductive plates 207 are connected to the signal via 209. The isolating slits 206 are separating the conductive plates 207 from ground conductors. The connection plate 219 is jointed to the signal via 209. The isolating slit 220 is separating the connection plate 219 from ground conductors. The clearance area 218 is separating the signal via 209 from ground conductors. The isolating slits 206 and 220 and the clearance area 218 can be considered as a second clearance region. The ground plates 205, the conductive plates 207 and the connection plate 219 are embedded in the conductor layers.

The third functional section includes two identical signal vias 212, ground vias 202, ground plates 214, two sets of conductive plates 221 and isolating slit 213. The signal vias 212 are jointed to the connection plate 219. The ground vias 202 are surrounding two signal vias 212. The ground plates 214 are connected to ground vias 202. One of the two sets of conductive plates 221 is connected to one signal via 212 and another set is connected to another signal via 212. The isolating slit 213 is separating the two sets of conductive plates 221 from each other and from ground conductors. Two signal vias 212 in this functional section are connected to bottom conductor plane 215. The isolating slit 213 can be considered as a third clearance region embedded in a dielectric 216. The ground plates 214 and the two sets of conductive plates 221 are embedded in the conductor layers.

Thus in the vertical direction, the first functional section is extended from the first pad 204 to the connection pad 217 (including these pads), the second functional section is disposed from the connection pad 217 to the connection plate 219 (including connection plate 219), and the third functional section is arranged from the connection plate 219 to the bottom conductor plane 215.

Figure 2A:
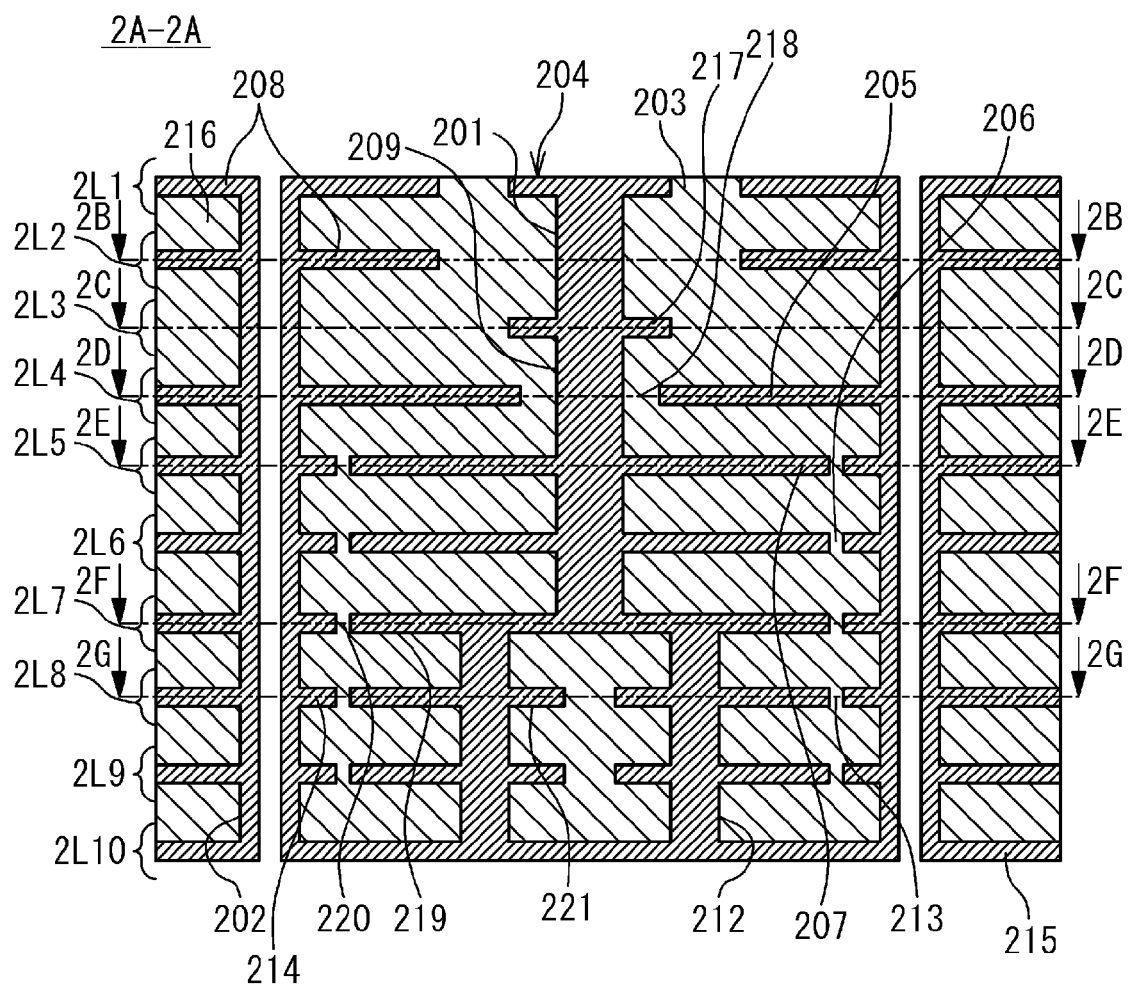
FIG. 2A is a vertical cross-sectional view illustrating a via structure in another exemplary embodiment of the present invention.
Figure 2B:
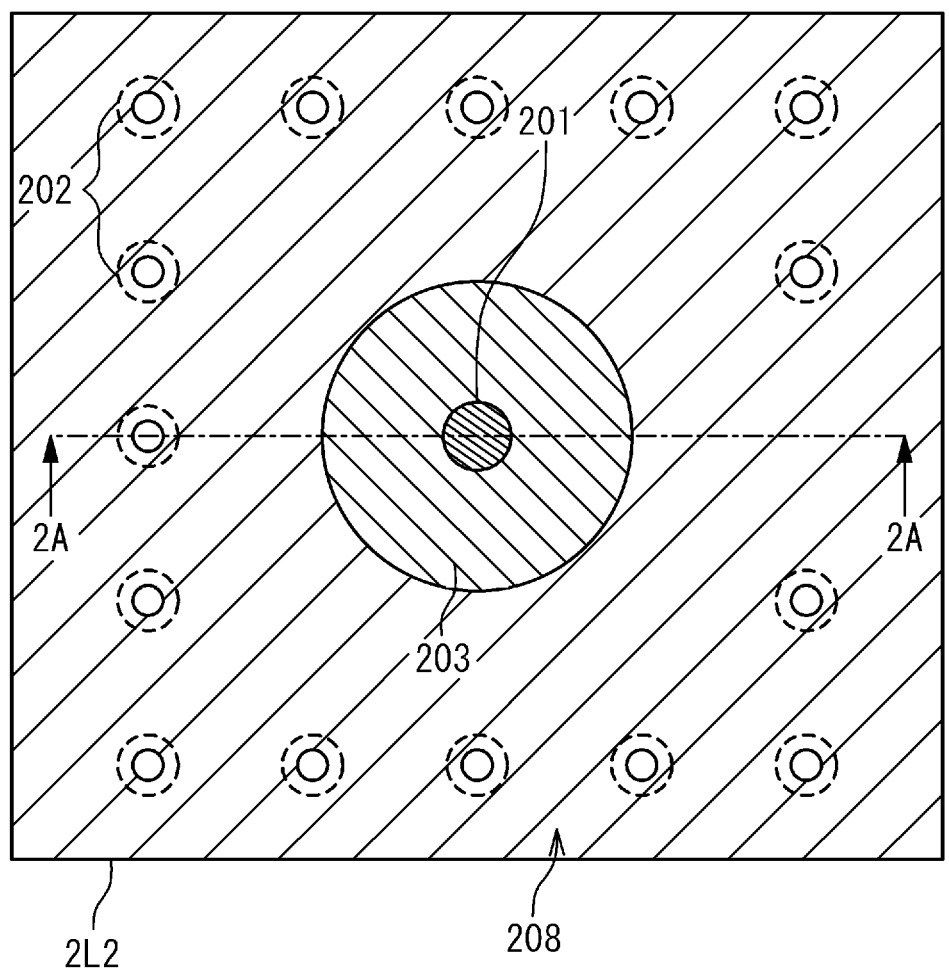
FIG. 2B is a horizontal cross-sectional view of the via structure shown in FIG. 2A on the 2B section.
Figure 2C:
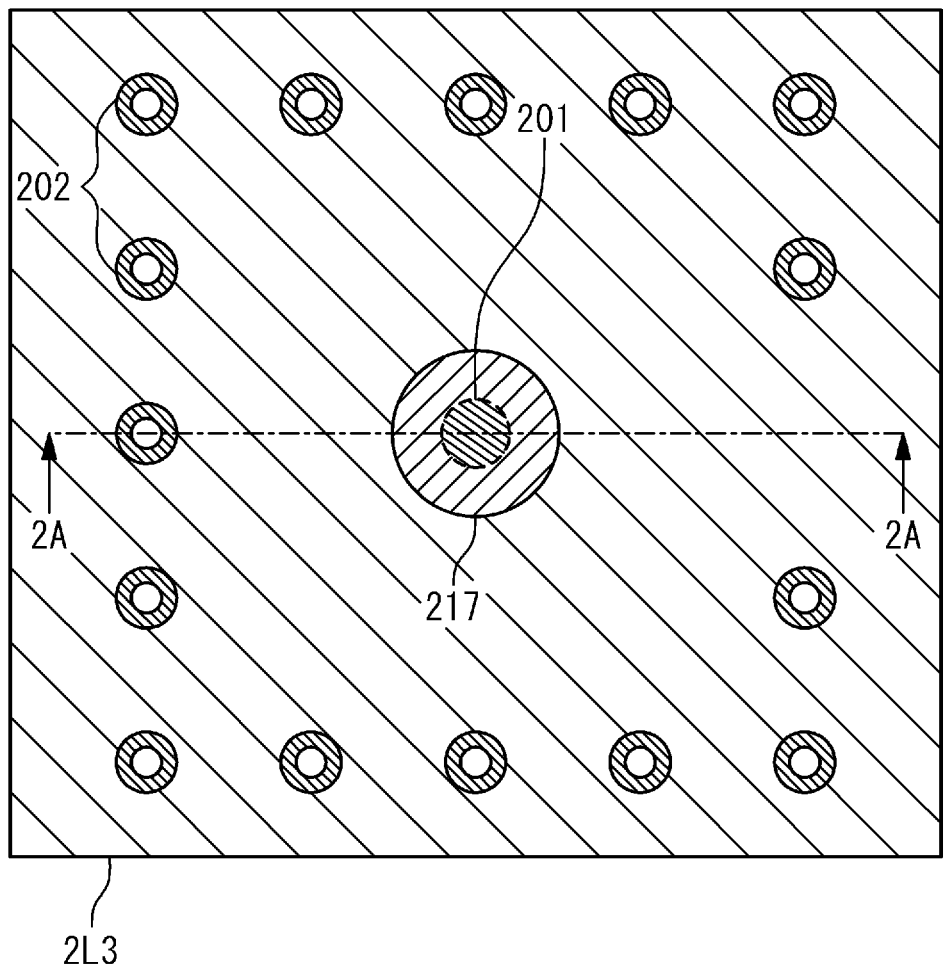
FIG. 2C is a horizontal cross-sectional view of the via structure shown in FIG. 2A on the 2C section.
Figure 2D:
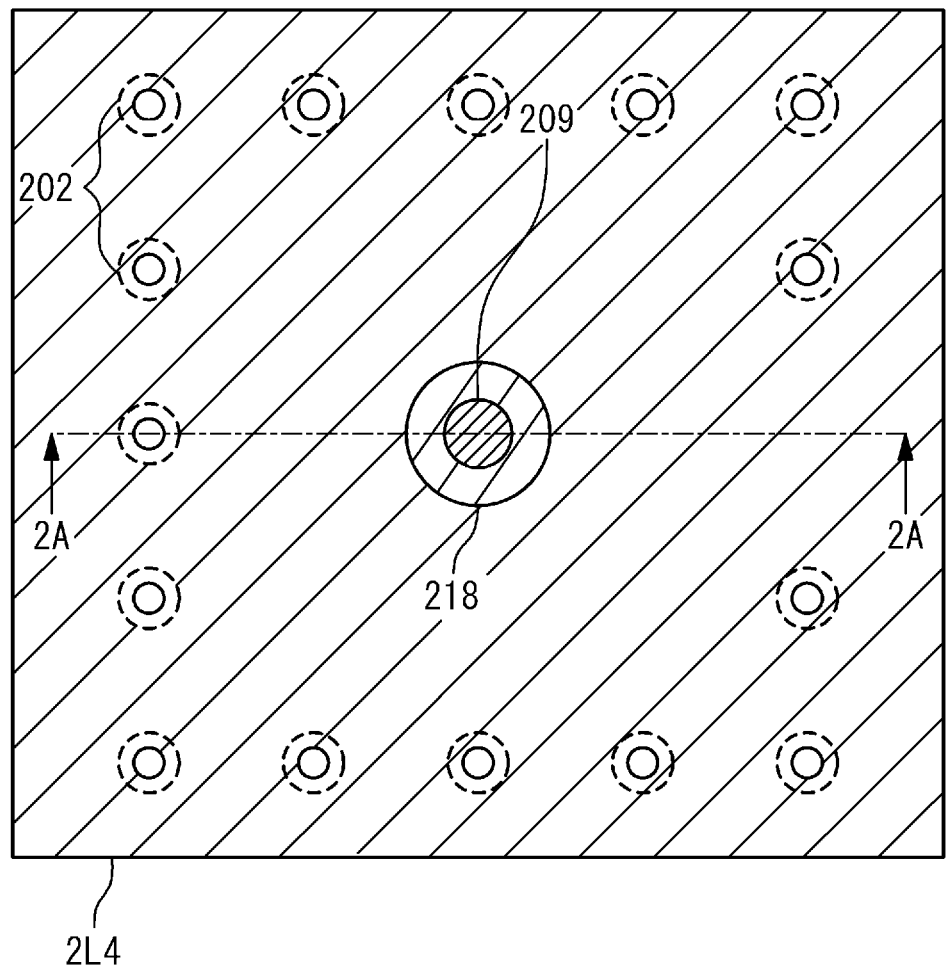
FIG. 2D is a horizontal cross-sectional view of the via structure shown in FIG. 2A on the 2D section.
Figure 2E:
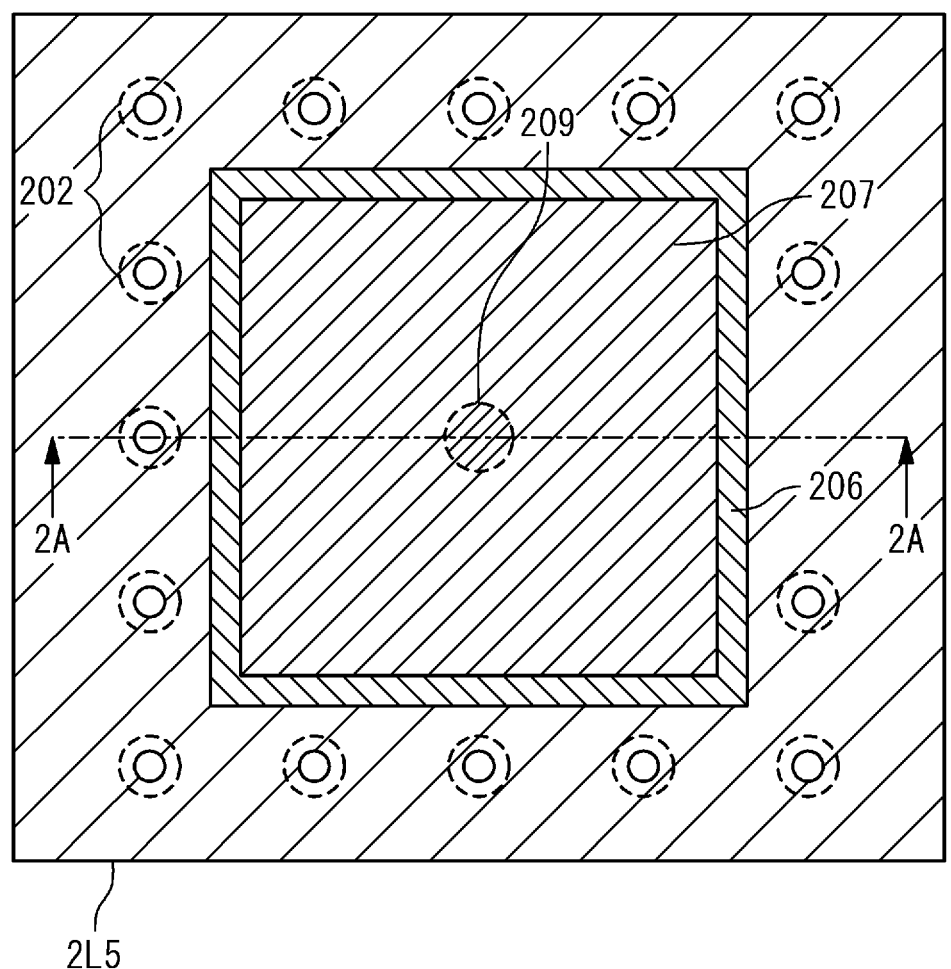
FIG. 2E is a horizontal cross-sectional view of the via structure shown in FIG. 2A on the 2E section.
Figure 2F:
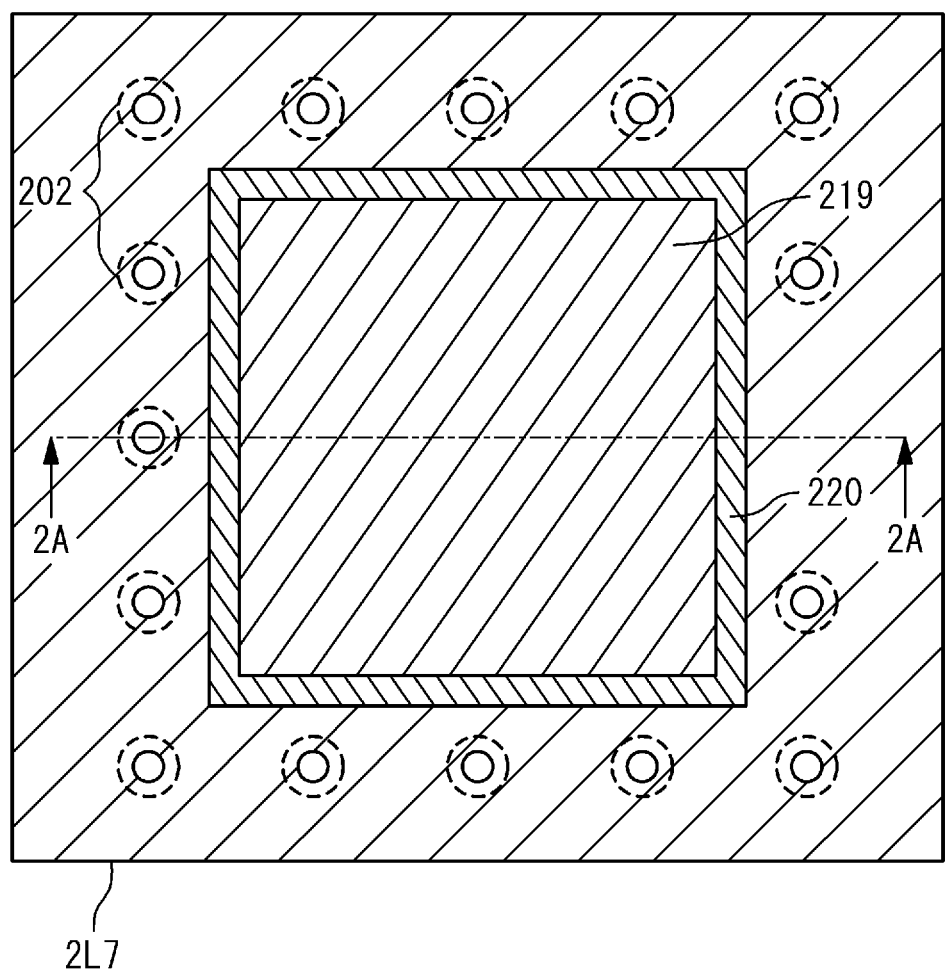
FIG. 2F is a horizontal cross-sectional view of the via structure shown in FIG. 2A on the 2F section.
Figure 2G:
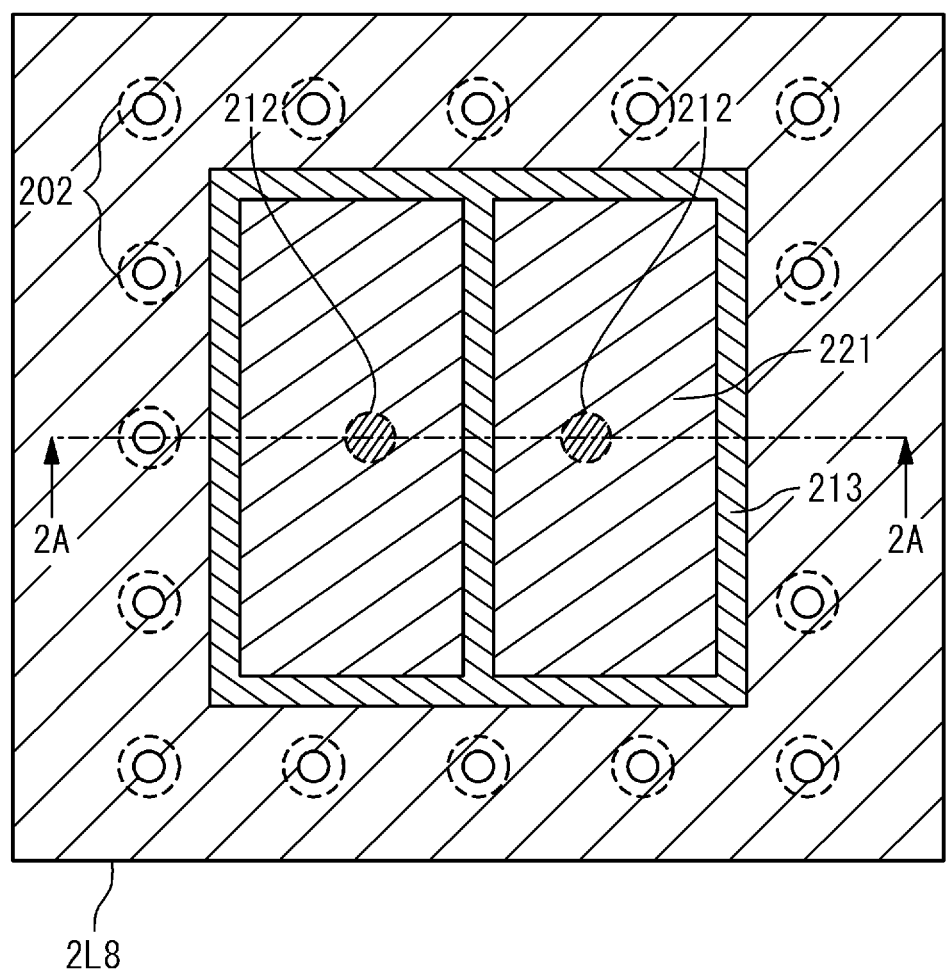
FIG. 2G is a horizontal cross-sectional view of the via structure shown in FIG. 2A on the 2G section.
Figure 2H:
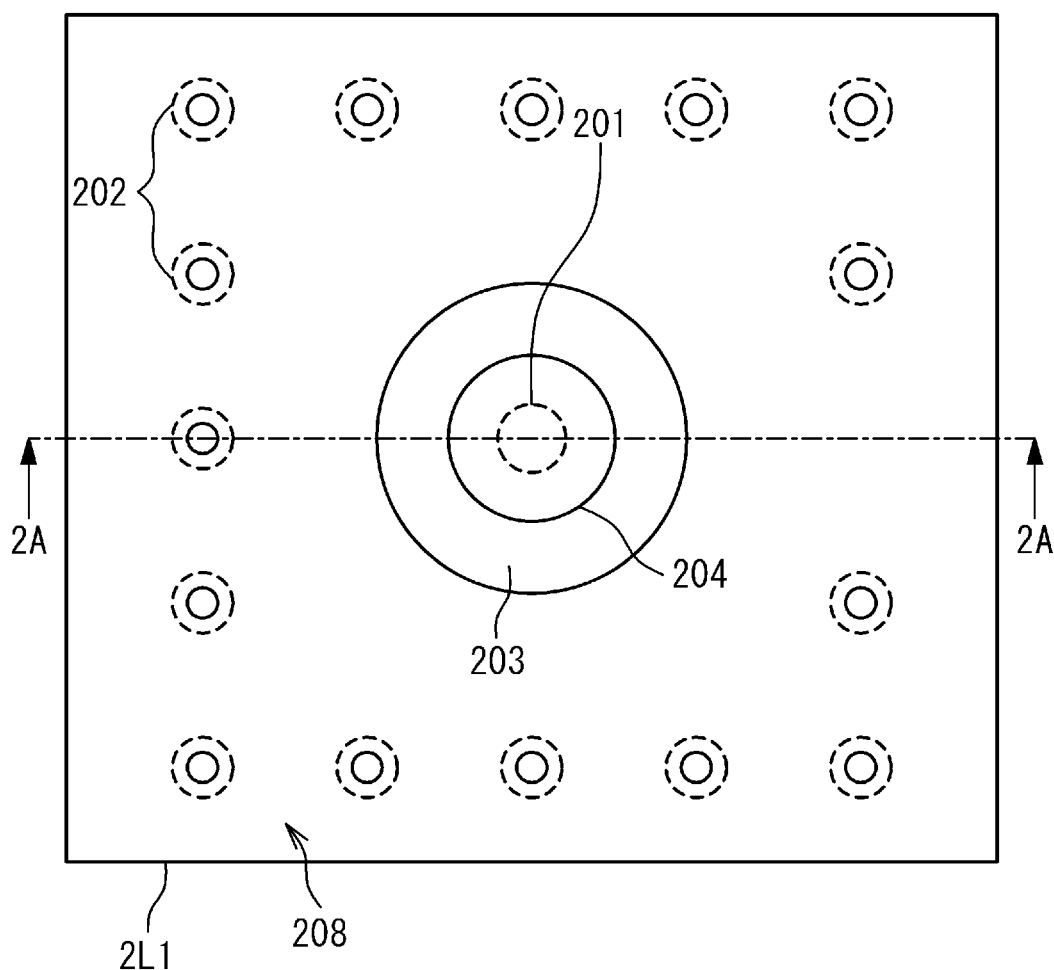
FIG. 2H is a top view of the via structure shown in FIG. 2A.
Figure 2I:
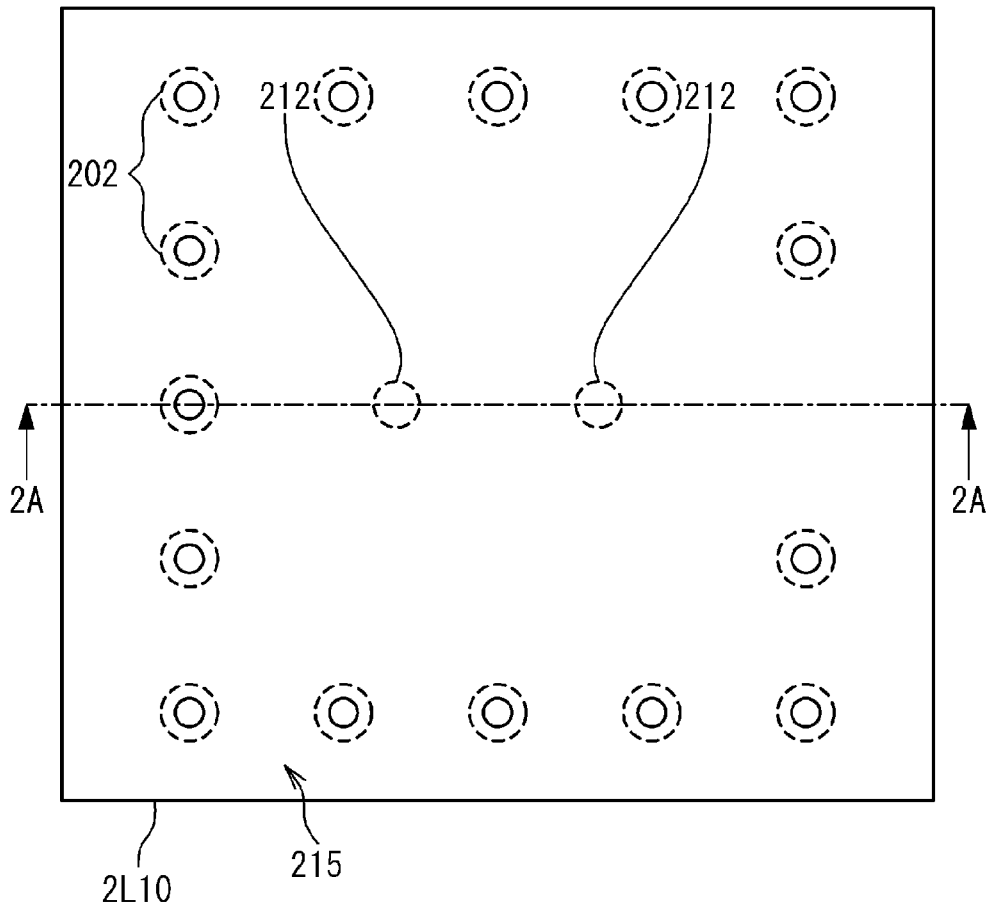
FIG. 2I is a bottom view of the via structure shown in FIG. 2A.
Figure 2J:
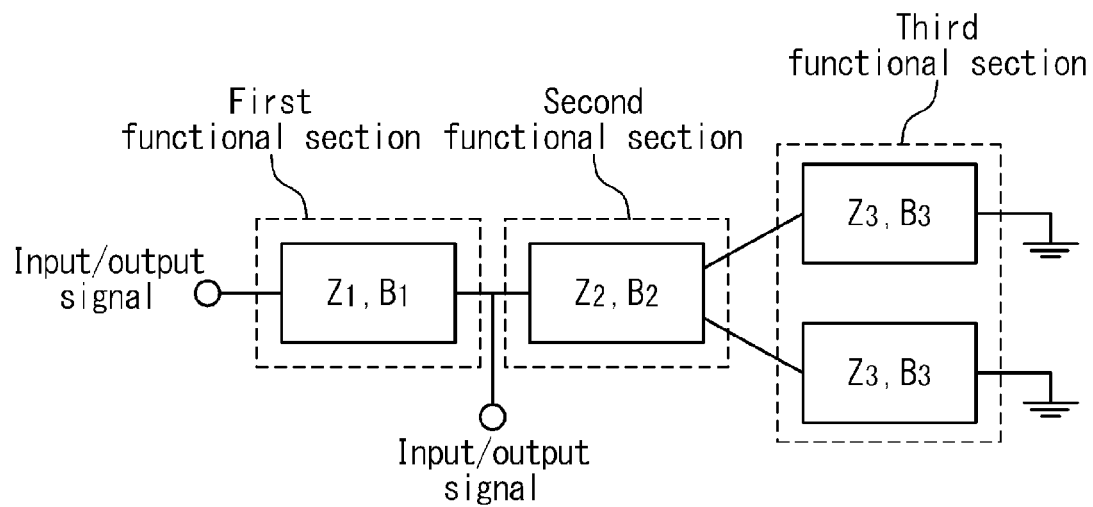
FIG. 2J is a simplified block diagram of the via structure shown in FIGS. 2A to 2I.

In FIG. 2J a simplified block diagram of signaling in the via structure is shown. This via structure is similar to that of the FIG. 1J therefore a detailed description of this block diagram is omitted.

Here an exemplary embodiment of a filter which including two sets of via structures of the present invention is shown in FIGS. 3A to 3F. The filter is formed in a six-conductor-layer substrate including stacked conductor layers 3L1, 3L2, 3L3, 3L4, 3L5, and 3L6 which are isolated by a dielectric 316.

In this filter, the two sets of via structures are connected by a coplanar transmission line 318.

Each of the two sets of via structures forming the filter has three functional sections. It should be noted that in each of those via structures the first functional section includes a first pad 304, a signal via 301, ground vias 302, a ground plate 308 and a clearance area 303. The connection pad is registered to the first pad 304 in this structure. The signal via 301 is connected to the first pad 304. The ground vias 302 are surrounding the signal via 301. The ground plate 308 is connected to the ground vias 302. The clearance area 303 is isolating the first pad 304 from ground conductors. The clearance area 303 can be considered as a first clearance region embedded in the dielectric 316.

The first pads 304 in both via structures are used as input or output ports of the filter.

Each of the second functional sections has a signal via 309, ground vias 302, ground plates 305, conductive plates 306, isolating slits 307 and 310 and a connection plate 311. The signal via 309 is jointed to the first pad 304. The ground plates 305 are connected to the ground vias 302. The conductive plates 306 are connected to the signal via 309. The isolating slits 307 are separating the conductive plates 306 from ground conductors. The connection plate 311 is jointed to the signal via 309. The isolating slit 310 is separating the connection plate 311 from ground conductors. The isolating slits 307 and 310 can be considered as a second clearance region embedded in the dielectric 316. The ground plates 305, the conductive plates 306 and the connection plate 311 are embedded in the conductor layers.

Each of the two sets of third functional section includes two signal vias 312, ground vias 302, ground plates 315, two sets of conductive plates 314 and isolating slit 313. The two signal vias 312 are jointed to the connection plate 311. The ground vias 302 are surrounding two signal vias 312. The ground plates 315 are connected to ground vias 302. One of the two sets of conductive plates 314 is connected to one signal via 312 and another set is connected to another signal via 312. The isolating slit 313 is separating the two sets of conductive plates 314 from each other and from ground conductors. Two signal vias 312 in this functional section are connected to bottom conductor plane 317. The isolating slit 313 can be considered as a third clearance region embedded in the dielectric 316. The ground plates 315 and the two sets of conductive plates 314 are embedded in the conductor layers.

Figure 3A:
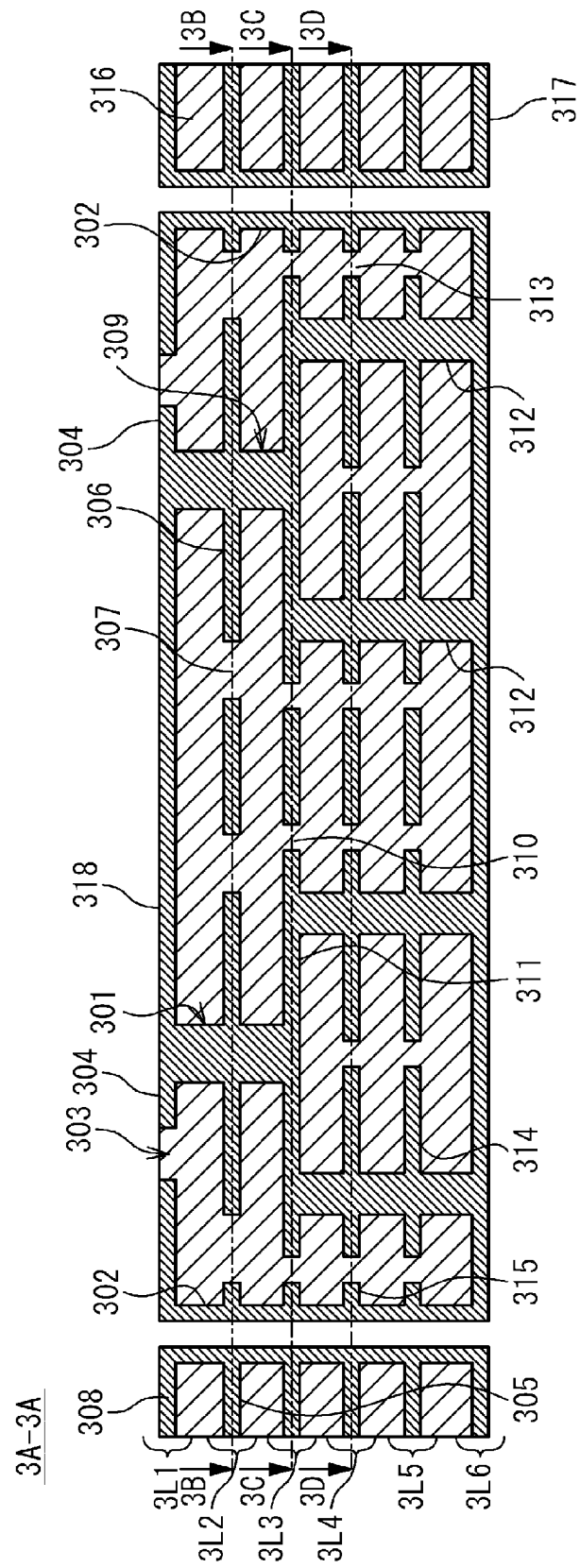
FIG. 3A is a vertical cross-sectional view of a filter formed by two via structures of the present invention and a coplanar stripline as connecting transmission line.
Figure 3B:
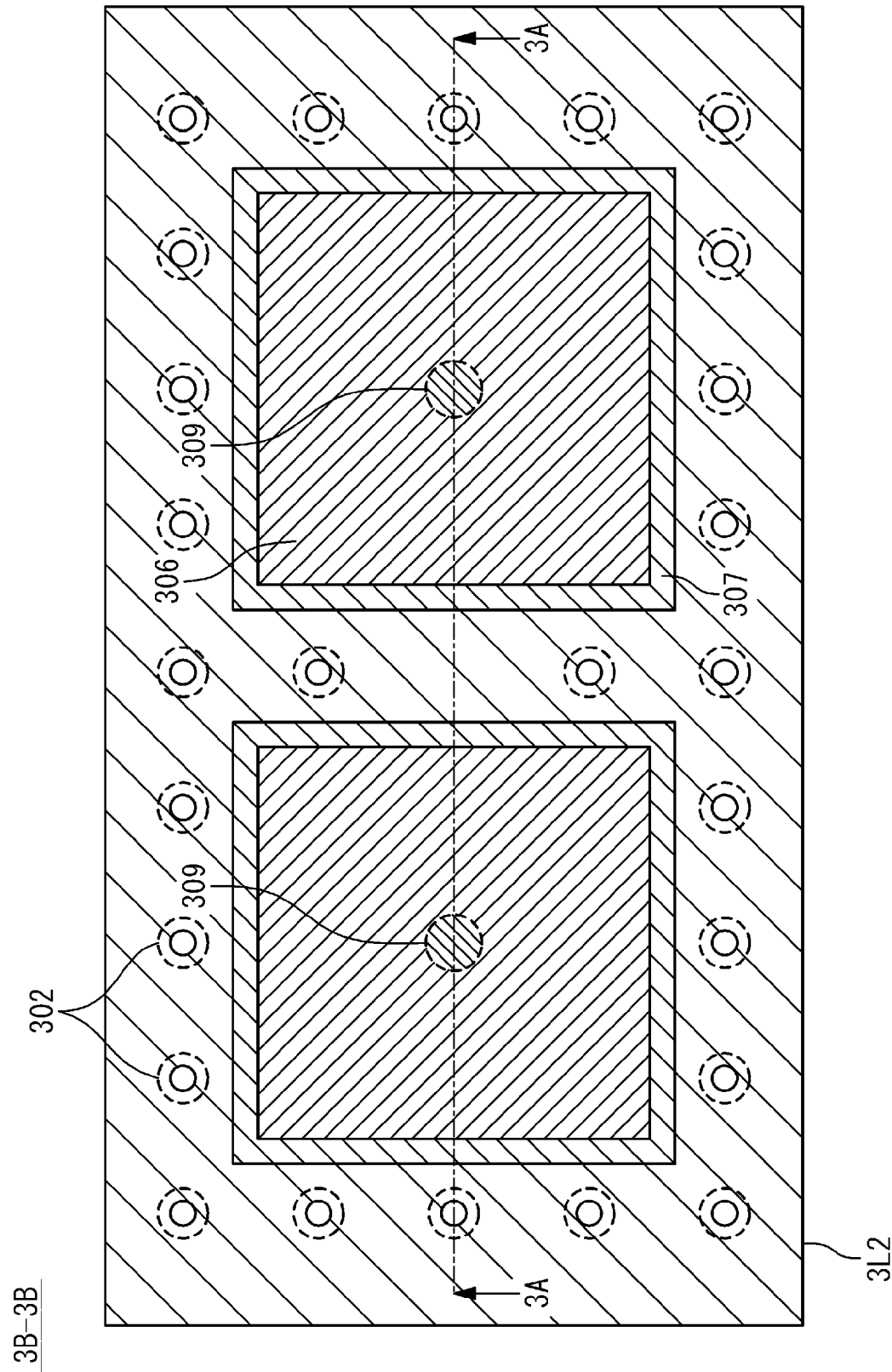
FIG. 3B is a horizontal cross-sectional view of the filter shown in FIG. 3A on the 3B section.
Figure 3C:
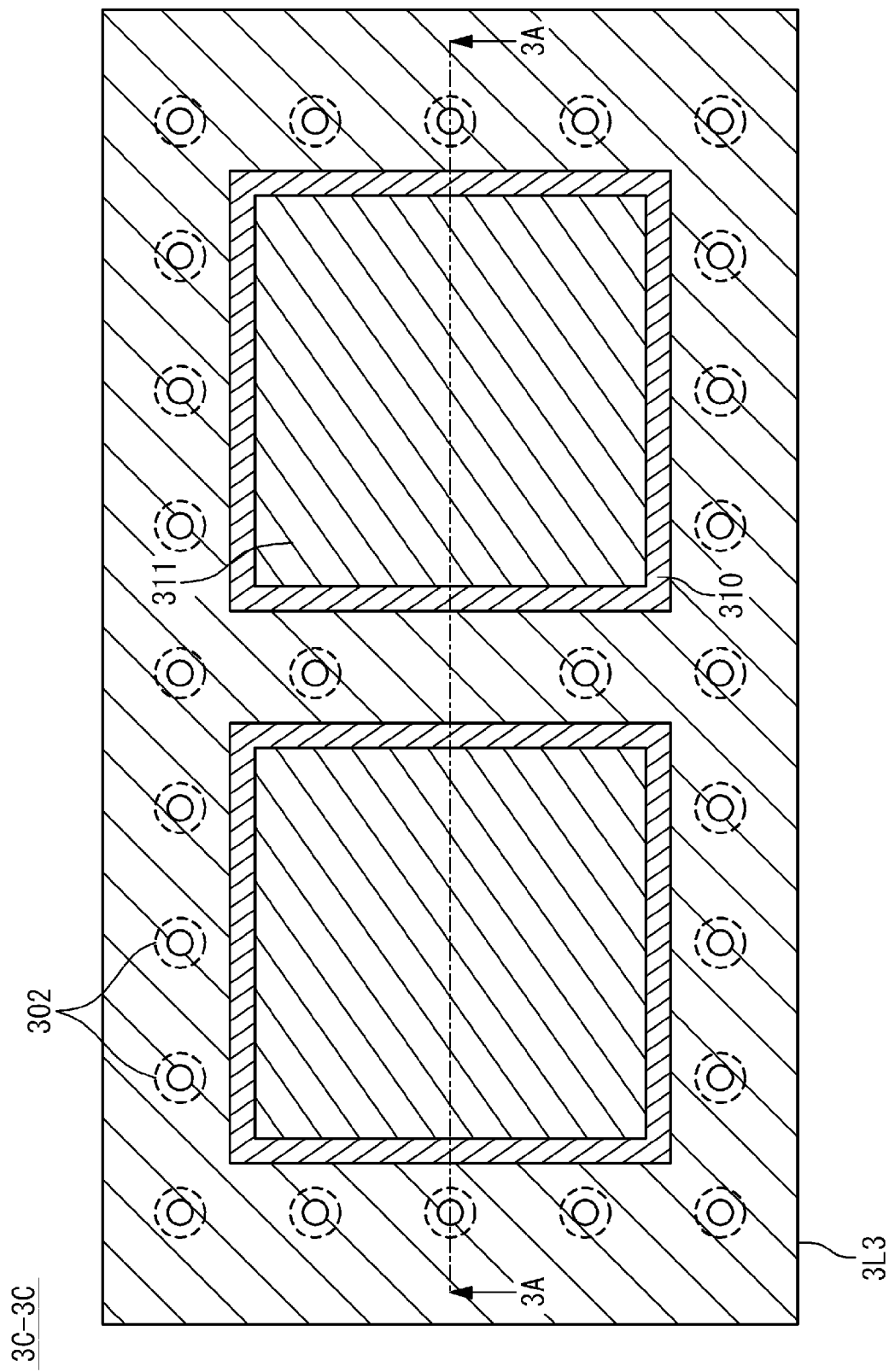
FIG. 3C is a horizontal cross-sectional view of the filter shown in FIG. 3A on the 3C section.
Figure 3D:
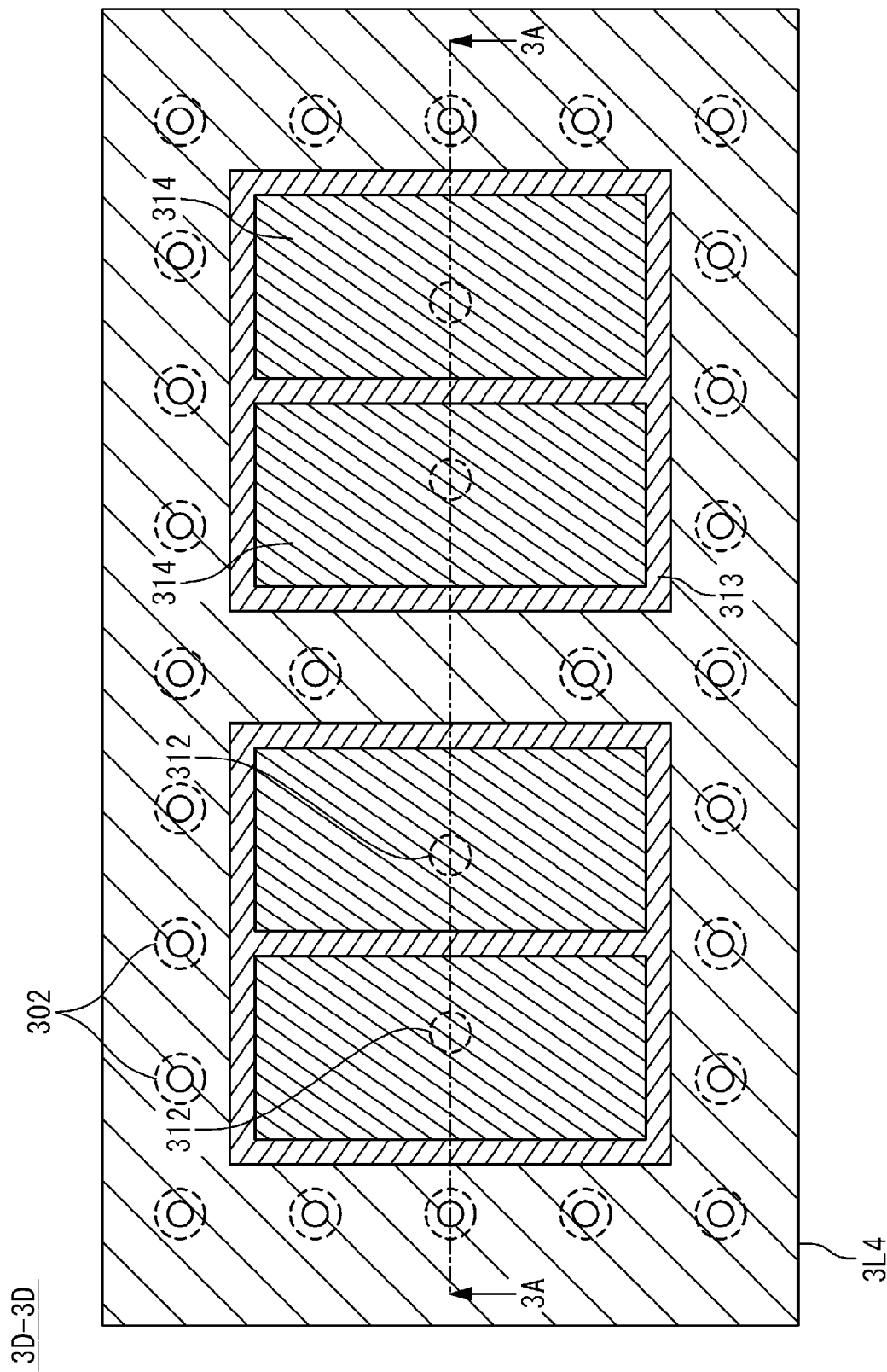
FIG. 3D is a horizontal cross-sectional view of the filter shown in FIG. 3A on the 3D section.
Figure 3E:
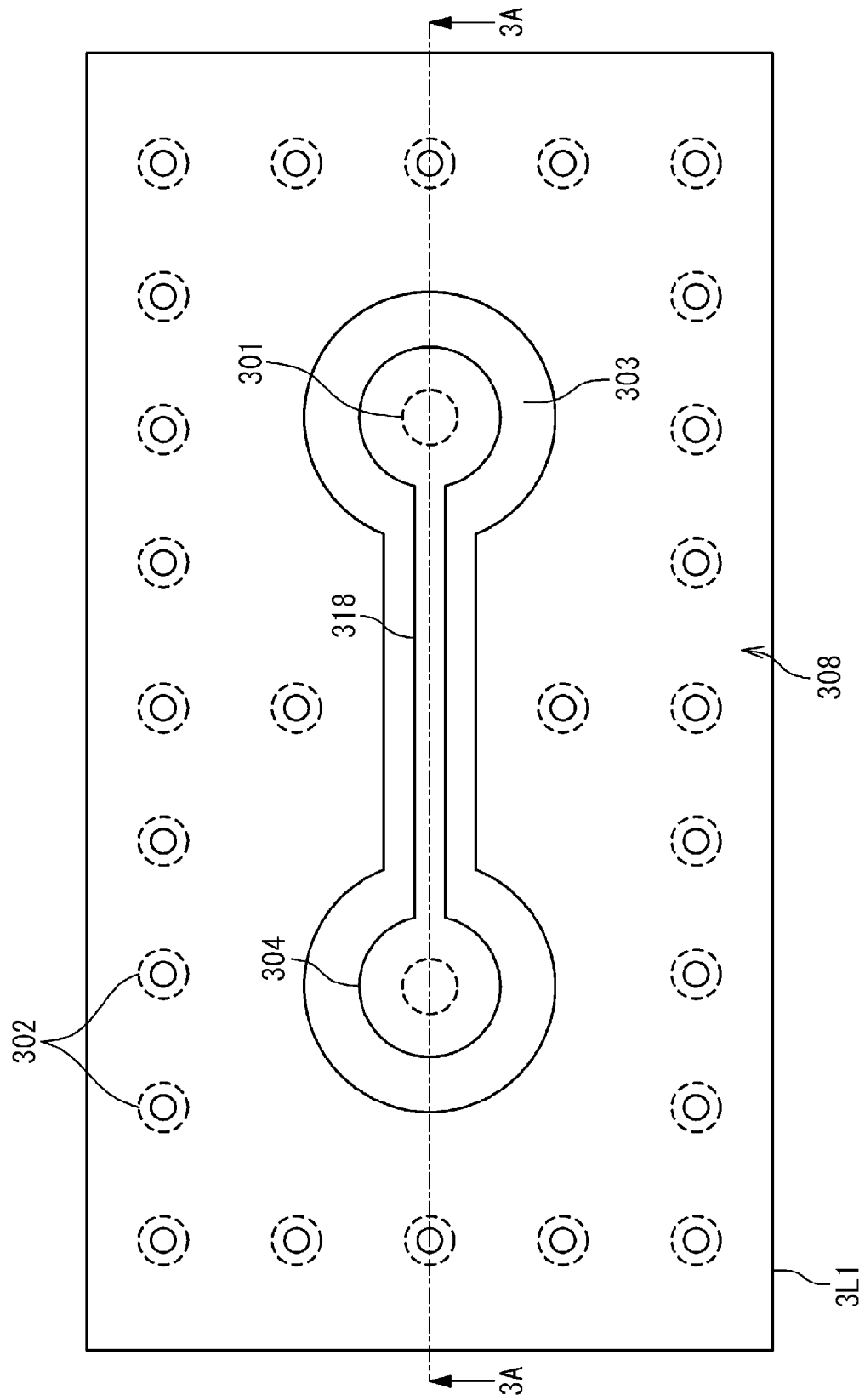
FIG. 3E is a top view of the filter shown in FIG. 3A.
Figure 3F:
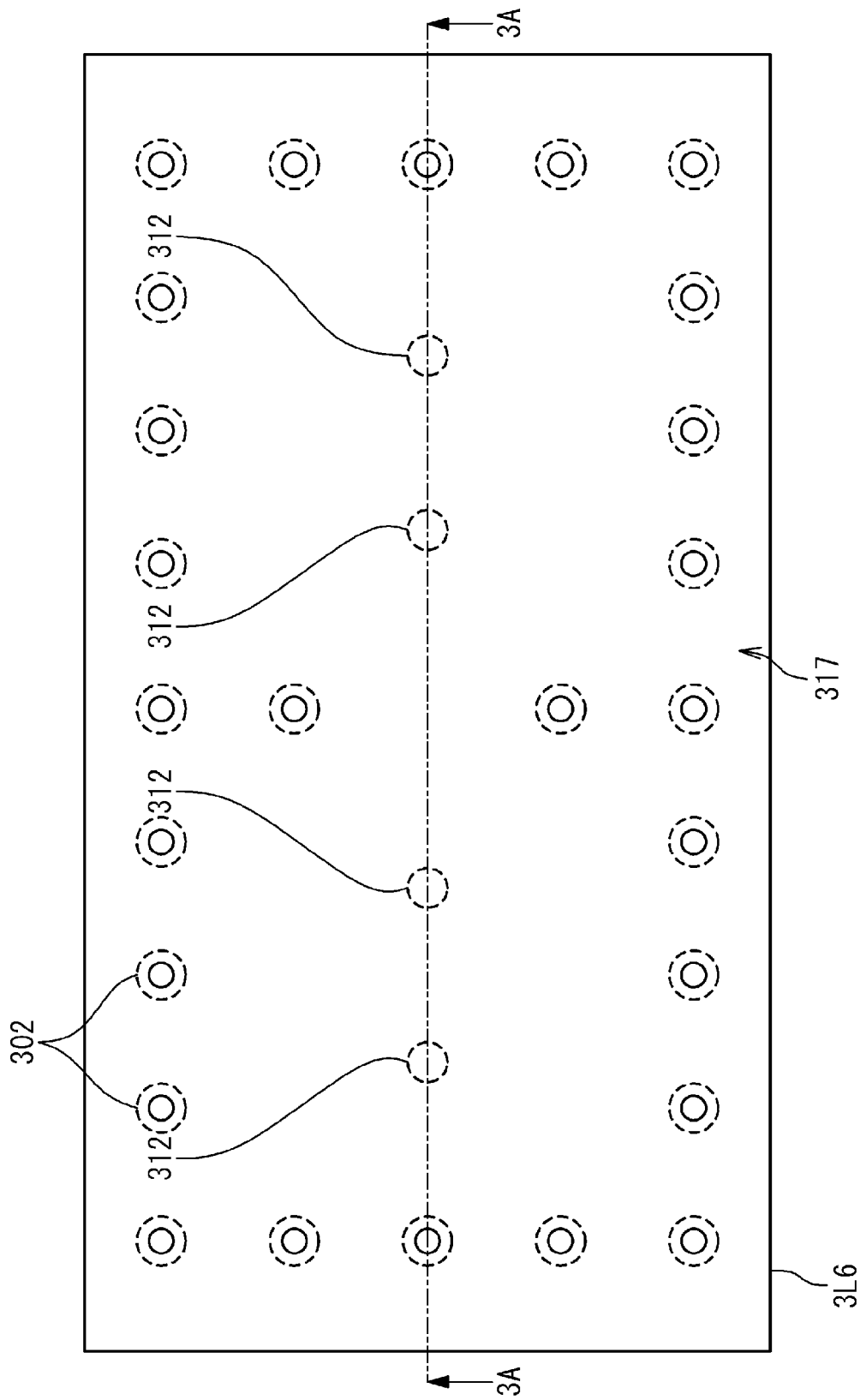
FIG. 3F is a bottom view of the filter shown in FIG. 3A.
Figure 3G:
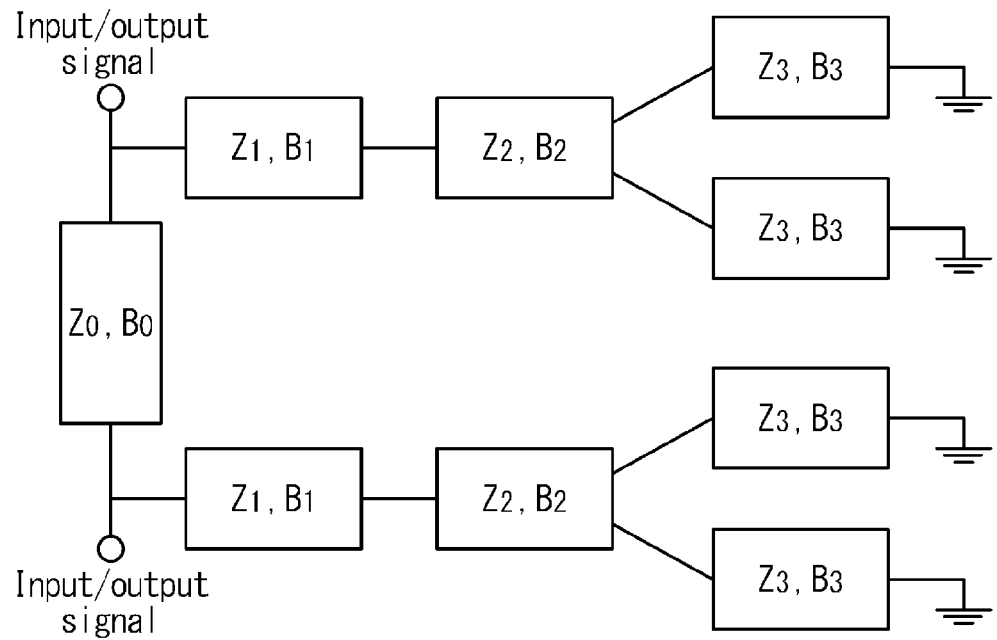
FIG. 3G is a simplified block diagram of the filter shown in FIGS. 3A to 3F.

In FIG. 3G, a simplified block diagram of the filter is shown. This block diagram shows one block corresponding to the transmission line 318 and two sets of block diagrams similar to that shown in FIG. 2J. The block corresponding to the transmission line 318 is connected between two input or output ports corresponding to the first pads 304 of the two sets of the first functional sections. Detailed description about the two sets of block diagrams similar to that of FIG. 2J is omitted.

Figure 4:
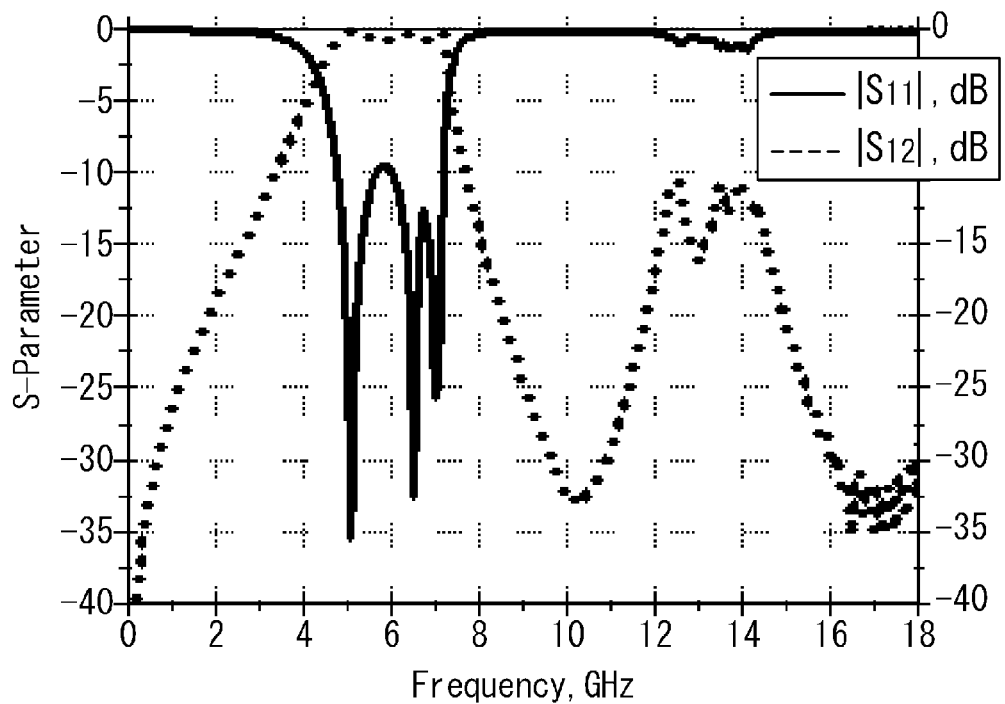
FIG. 4 is a graph showing the electrical performance of the filter forming by two invented via structures.
Figure 5A:
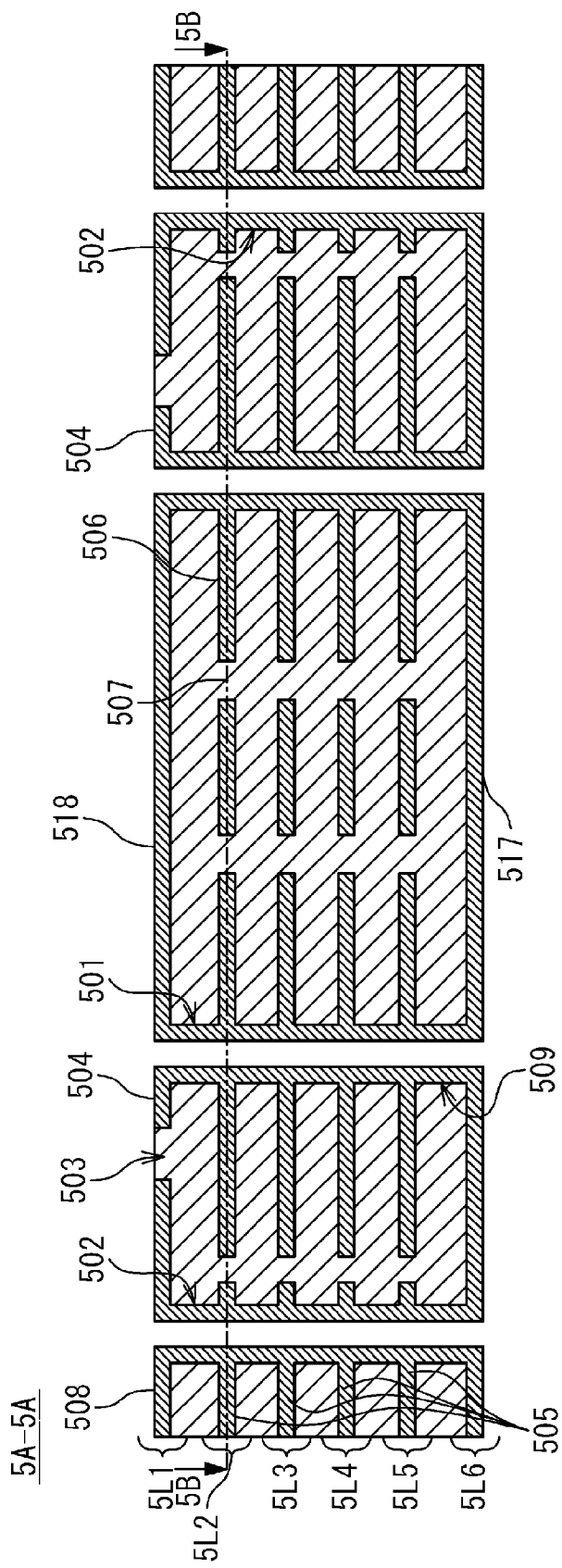
FIG. 5A is a vertical cross-sectional view of a relating art filter.
Figure 5B:
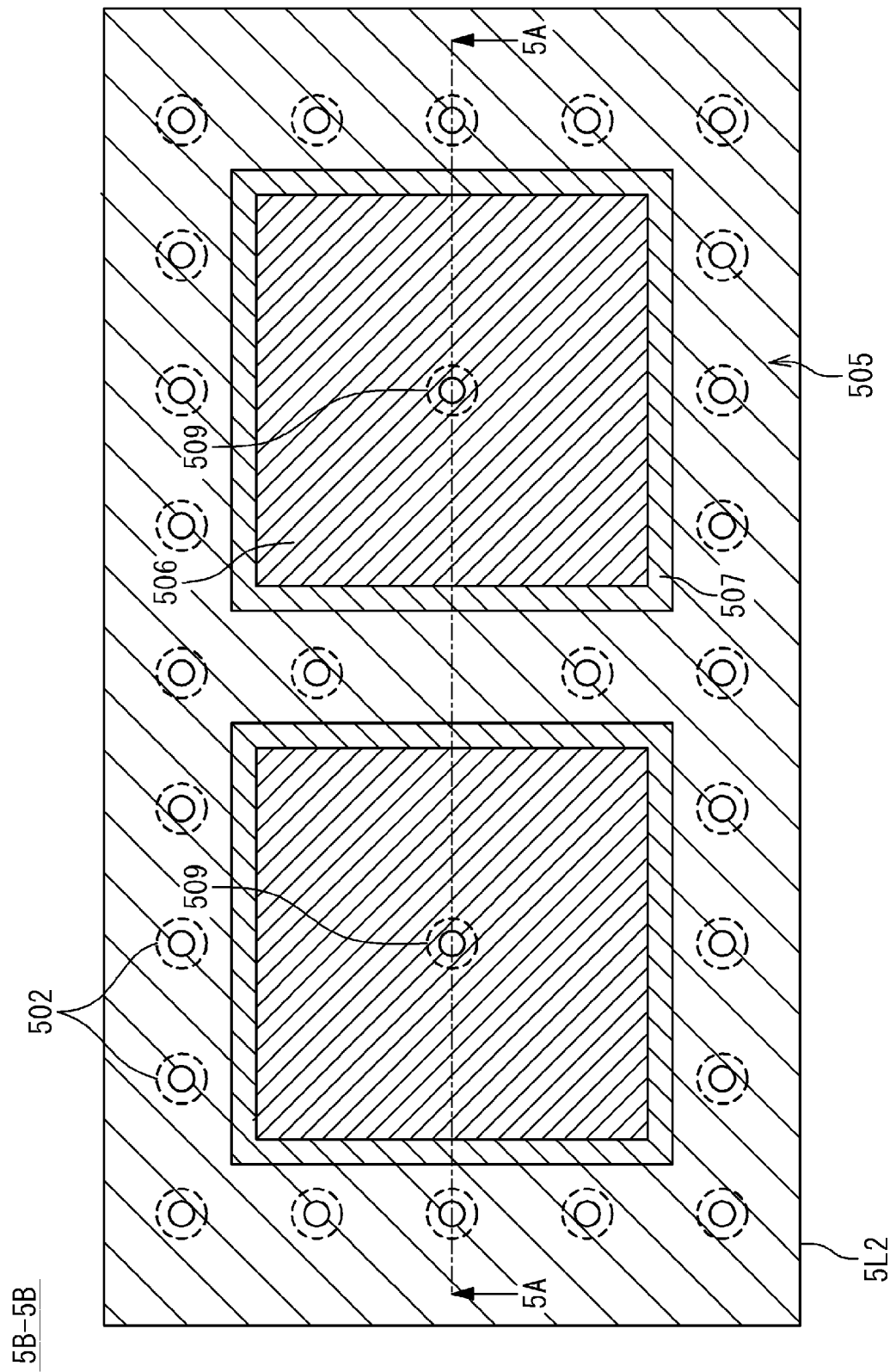
FIG. 5B is a horizontal cross-sectional view of the relating art filter shown in FIG. 5A on the 5B section.
Figure 5C:
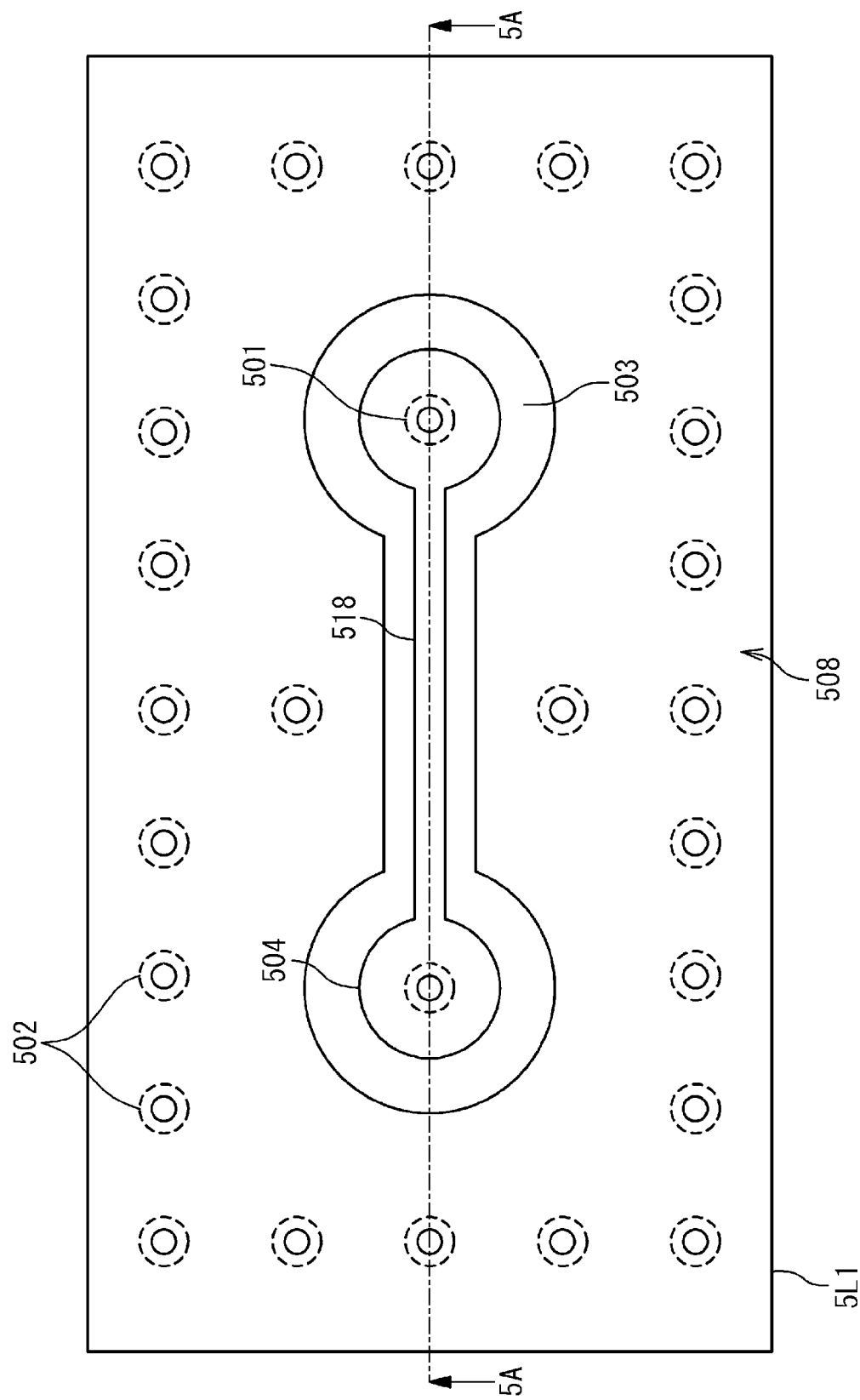
FIG. 5C is a top view of the relating art filter shown in FIG. 5A.
Figure 5D:
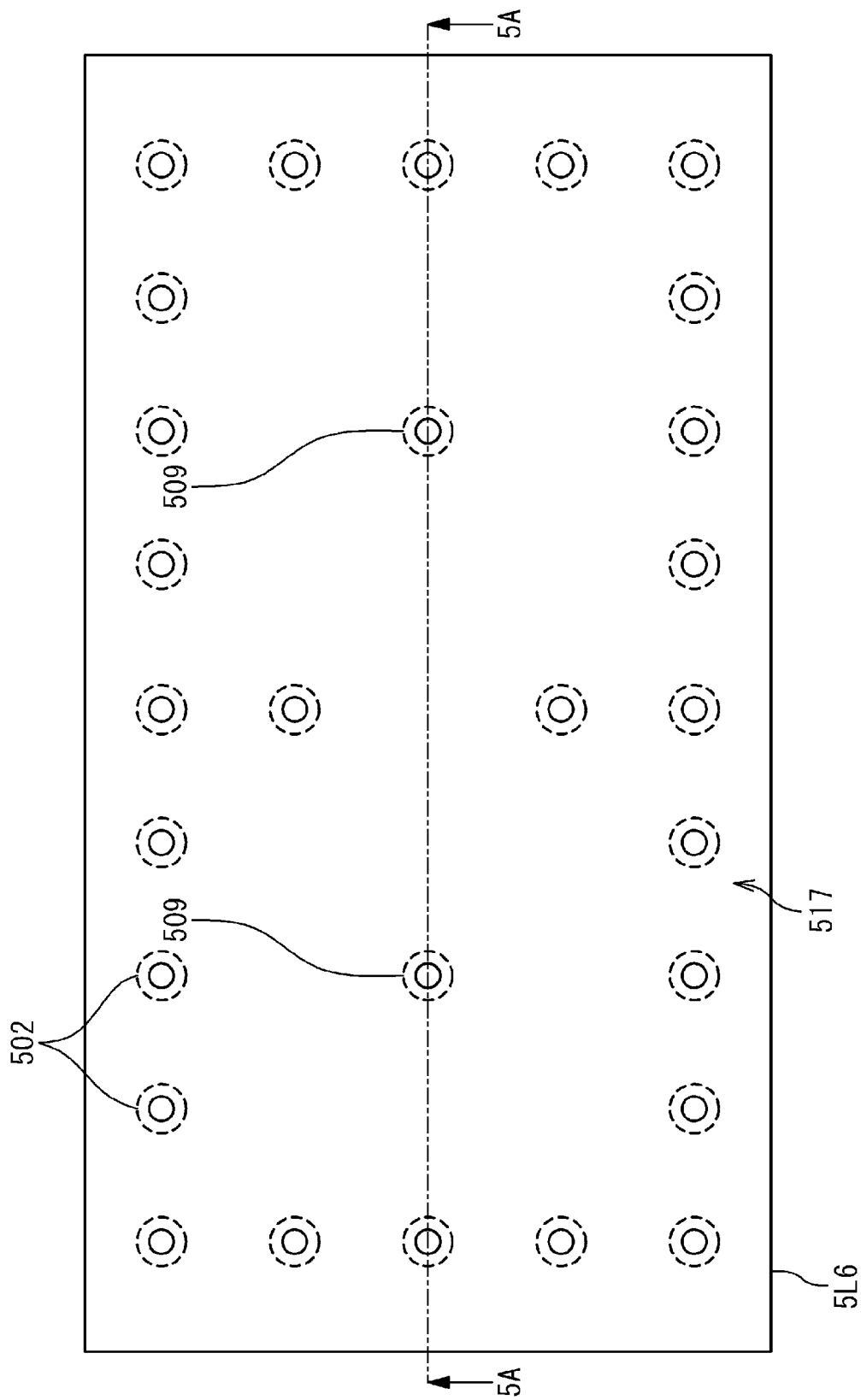
FIG. 5D is a bottom view of the relating art filter shown in FIG. 5A.

To show advantages of invented structures, magnitudes of return ($|S_{11}|$-parameter) and insertion ($|S_{12}|$-parameter) losses for the filter presented in FIGS. 3A to 3F are given in FIG. 4. These data were obtained by the Finite-Difference Time-Domain (FDTD) technique which is worldly-recognized as one of the most adequate and accurate numerical techniques for electromagnetic analysis. In an example presented here, six copper conductive layers were isolated by a dielectric having the relative permittivity 4.17 and loss tangent 0.023 as was assumed in simulations. The first pads 304 of the via structures were used as input and output ports of the filter. Total thickness of the six-conductor-layer substrate was 2.9 mm and the thickness of each copper conductor layer was 0.035 mm.

The dimensions of functional sections of the via structures were as following.

In the first functional section, the diameter of each of the first pads 304 was 1.0 mm and the diameter of the clearance area 303 was 1.4 mm.

In the second functional section, the diameter of each of the signal via 309 was 0.8 mm, the conductive plate 306 connected to the signal via 309 was the square form with the side of 2.7 mm, connection plate 306 connected to the signal via 309 was also the square form with the side of 2.7 mm, and the width of isolating slits 310 for both conductive plates 306 was 0.1 mm.

In the third functional section, the diameter of both signal vias 312 was 0.3 mm, the distance between these signal vias was 1.4 mm, and all plates 311 connected to both signal vias were the rectangular form with the length of 2.7 mm and the width of 1.3 mm.

As follows from simulated data presented in FIG. 4, additional transmission zeros are appeared in electromagnetic characteristics of the filter at frequencies of about 7 GHz and about 13 GHz. The first additional transmission zero leads to improvement of the filter skirt (including sharpness) in the in-band area. The second additional transmission zero reduces the unwanted resonance in the frequency band from about 12 GHz to about 15 GHz.

This example shows benefits in the use of invented via structures and filters formed by these via structures.

For comparison, a relating art filter was simulated here. This relating art filter is shown in FIGS. 5A to 5D and is also formed in the six-conductor-layer substrate including conductor layers 5L1, 5L2, 5L3, 5L4, 5L5, and 5L6 which are isolated by the dielectric 516. In the relating art filter, two via structures are connected by the coplanar transmission line 518.

The via structures forming the relating art filter has two functional sections unlike via structures of the present invention having three functional sections.

Thus, each of the first functional section in the relating art via structure includes a first pad 504, a signal via 501, ground vias 502, a ground plate 508 and a clearance area 503. The signal via 501 is connected to the first pad 504. The ground vias 502 are surrounding the signal via 501. The ground plate 508 is connected to the ground vias 502. The clearance area 503 is isolating the first pad 504 from ground conductors. The first pad 504 in both relating art via structures is used as input or output ports of the filter.

The second functional section has a signal via 509, ground vias 502, ground plates 505, conductive plates 506 and isolating slits 507. The signal via 509 is jointed to the first pad 504. The ground plates 505 are connected to the ground vias 502. The conductive plates 506 are connected to the signal via 509. The isolating slits 507 are separating the conductive plates 506 from ground conductors. Also, the signal via 509 in this functional section is connected to bottom conductor plane 517.

Figure 6:
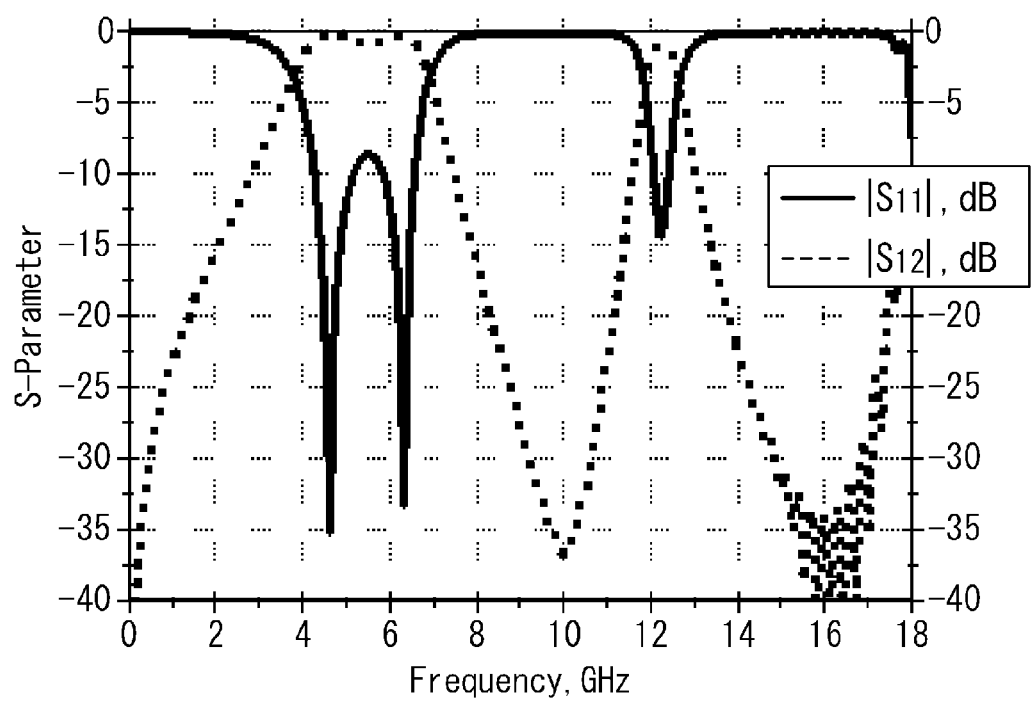
FIG. 6 is a graph showing the electrical performance of the relating art filter.
Figure 7A:
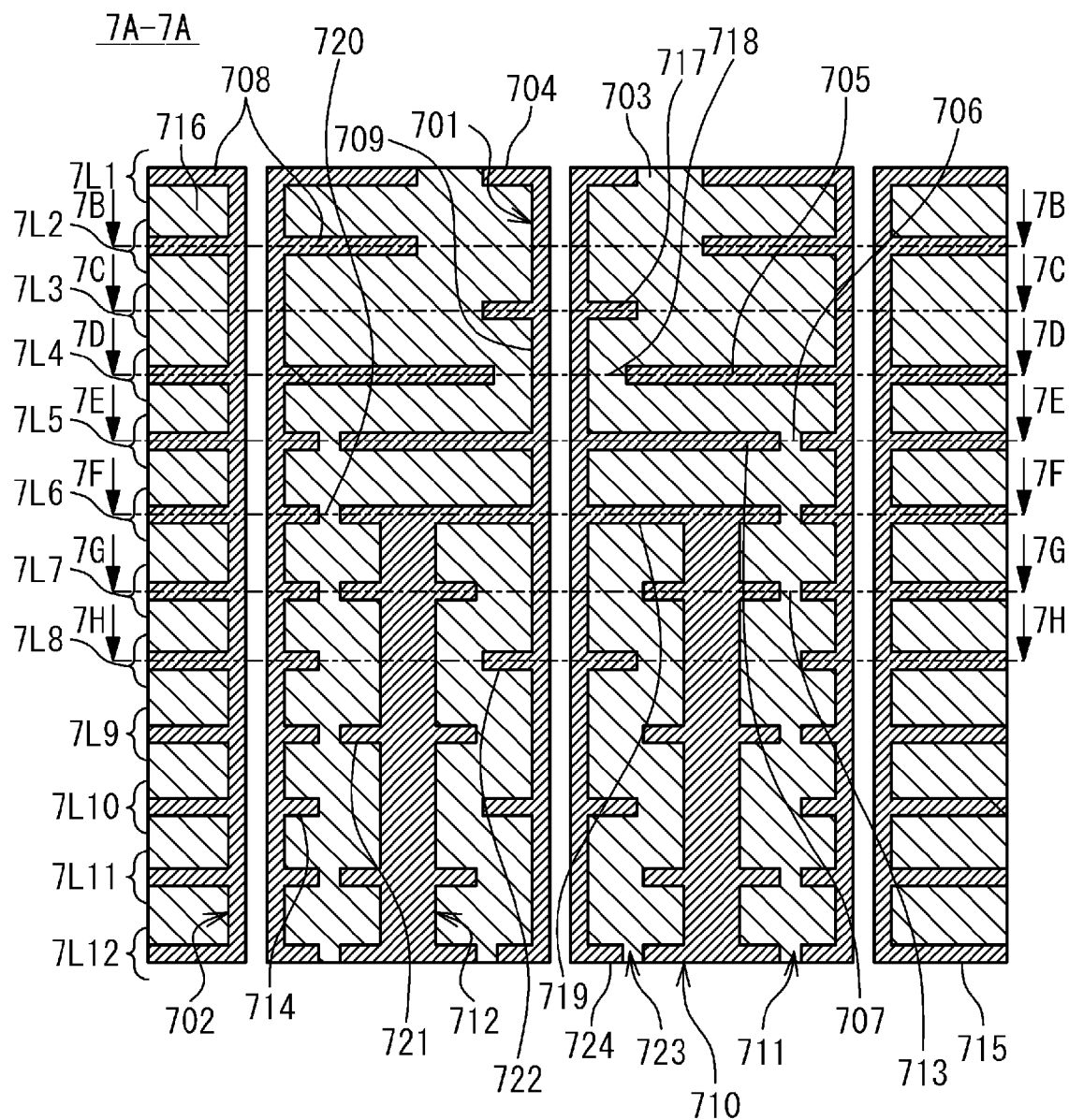
FIG. 7A is a vertical cross-sectional view illustrating a via structure in an exemplary embodiment of the present invention.
Figure 7B:
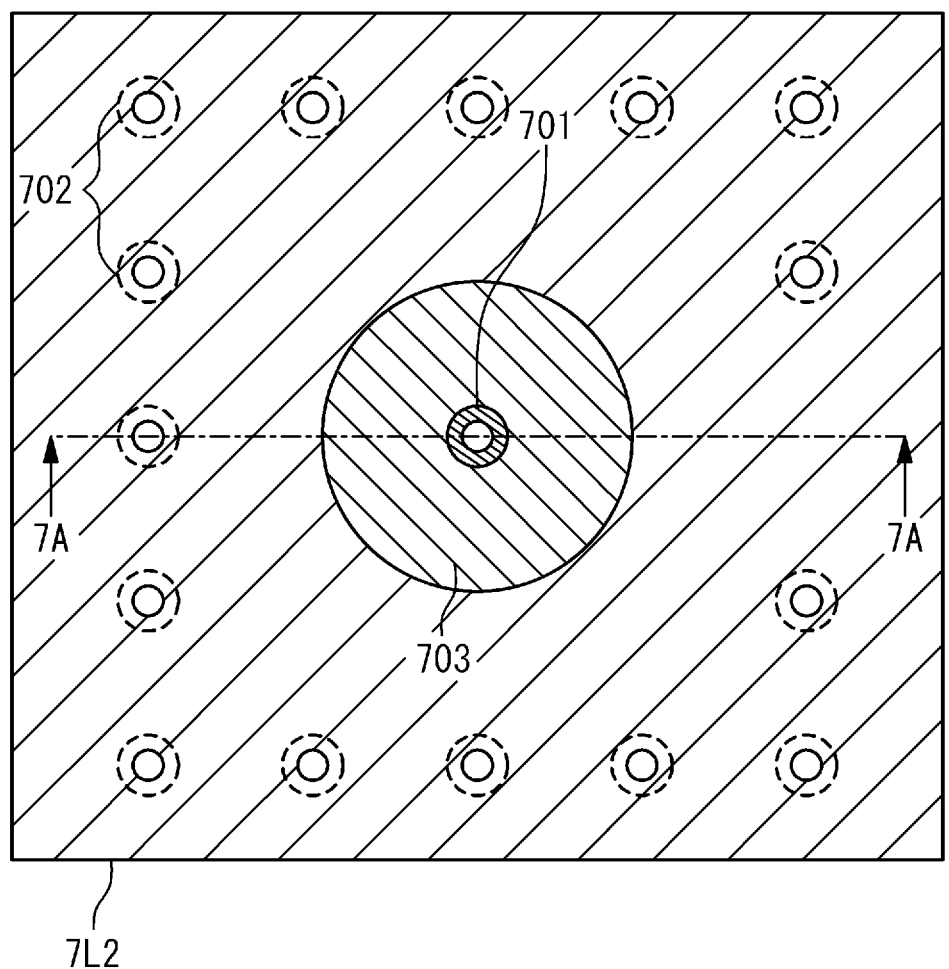
FIG. 7B is a horizontal cross-sectional view of the via structure shown in FIG. 7A on the 7B section.
Figure 7C:
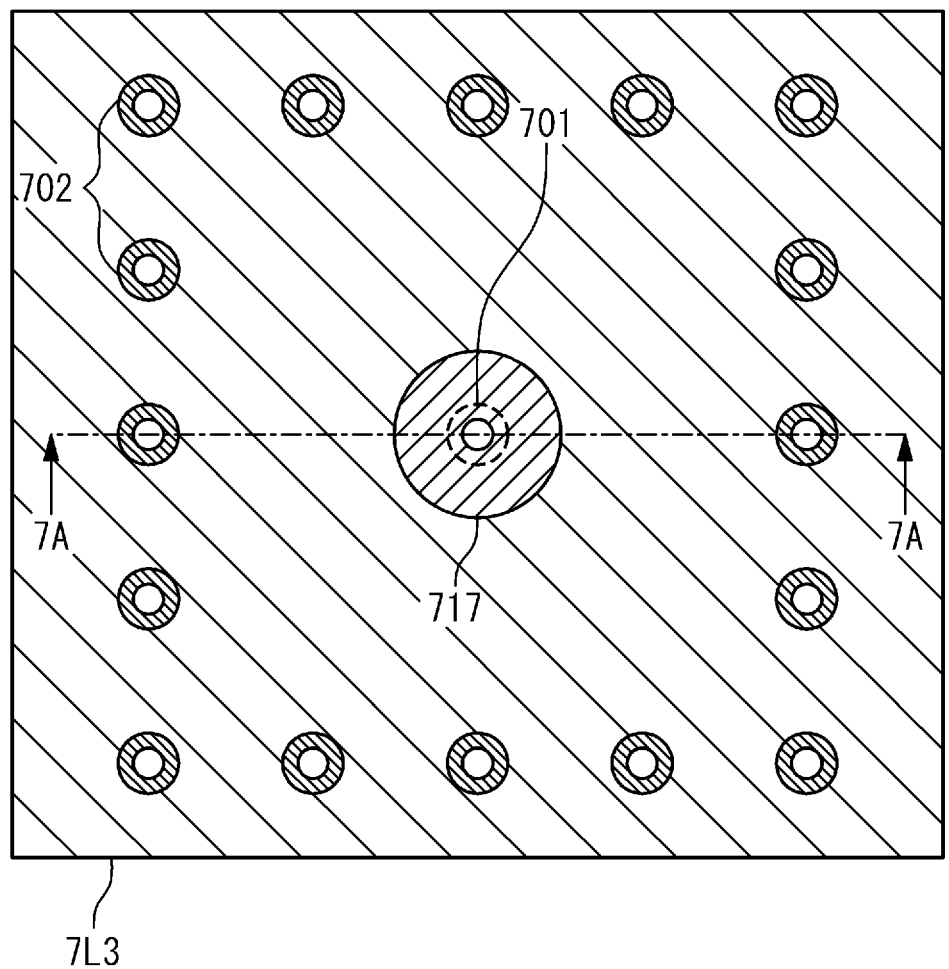
FIG. 7C is a horizontal cross-sectional view of the via structure shown in FIG. 7A on the 7C section.
Figure 7D:
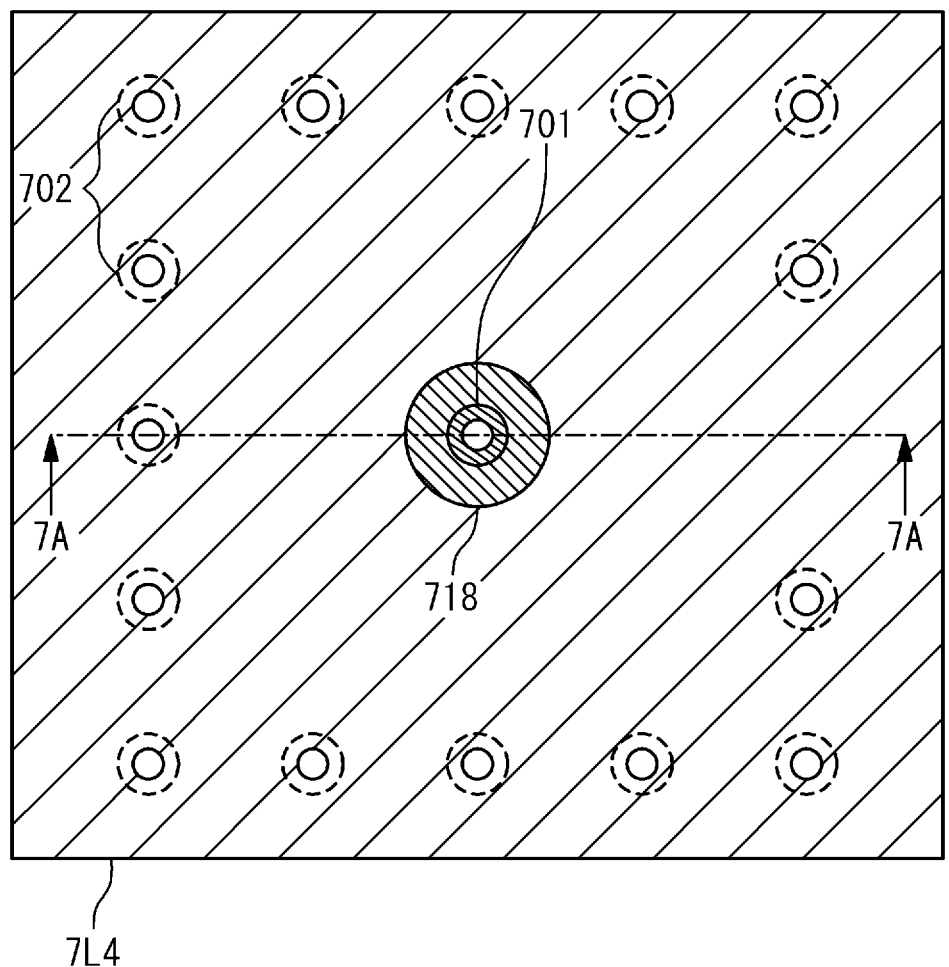
FIG. 7D is a horizontal cross-sectional view of the via structure shown in FIG. 7A on the 7D section.
Figure 7E:
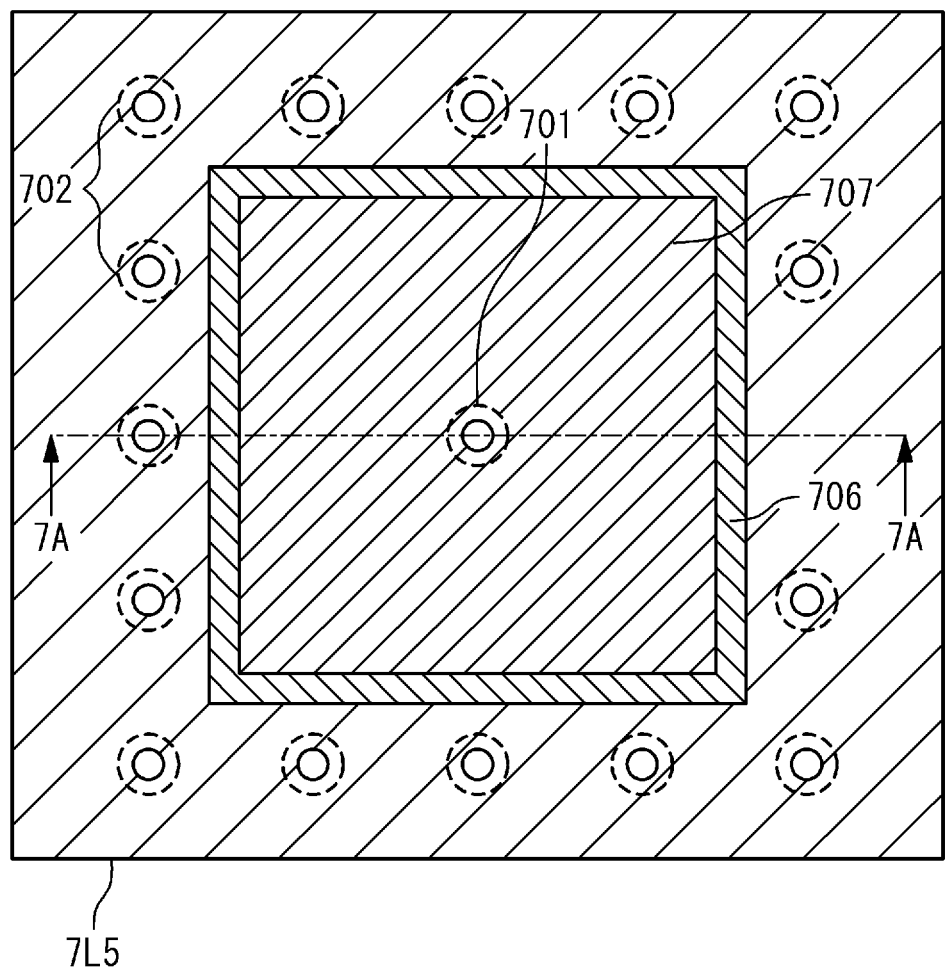
FIG. 7E is a horizontal cross-sectional view of the via structure shown in FIG. 7A on the 7E section.
Figure 7F:
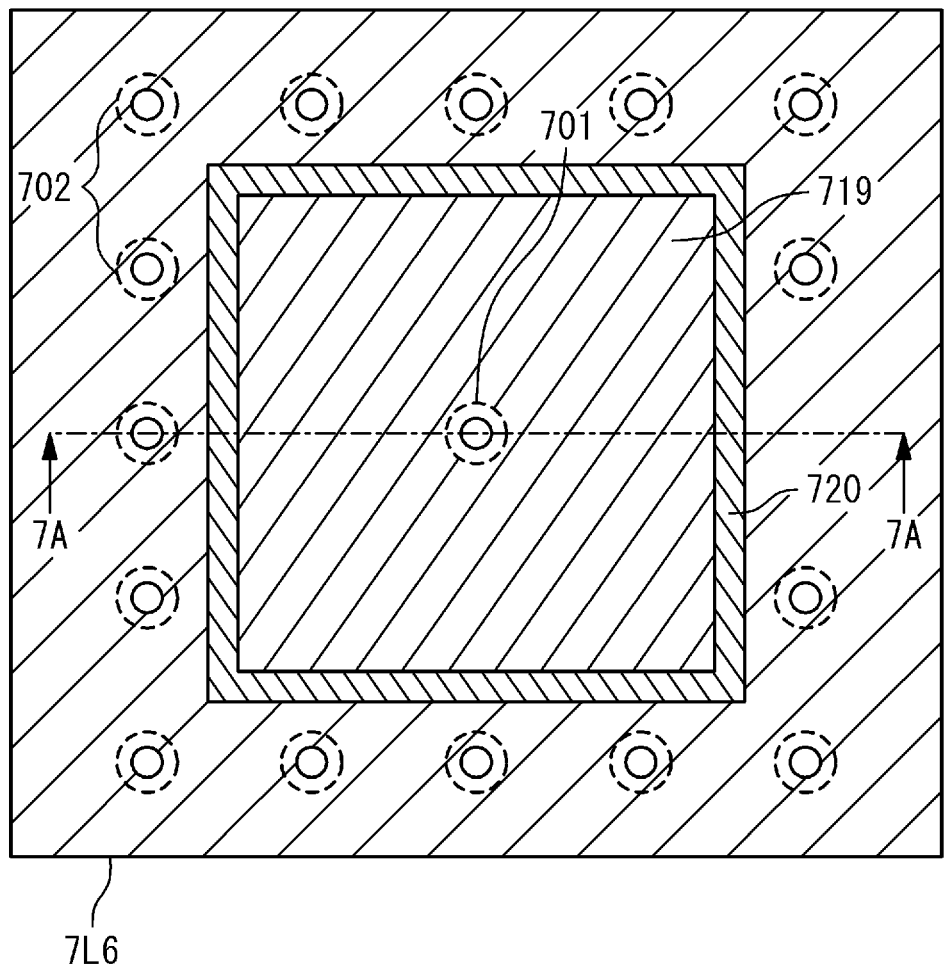
FIG. 7F is a horizontal cross-sectional view of the via structure shown in FIG. 7A on the 7F section.
Figure 7G:
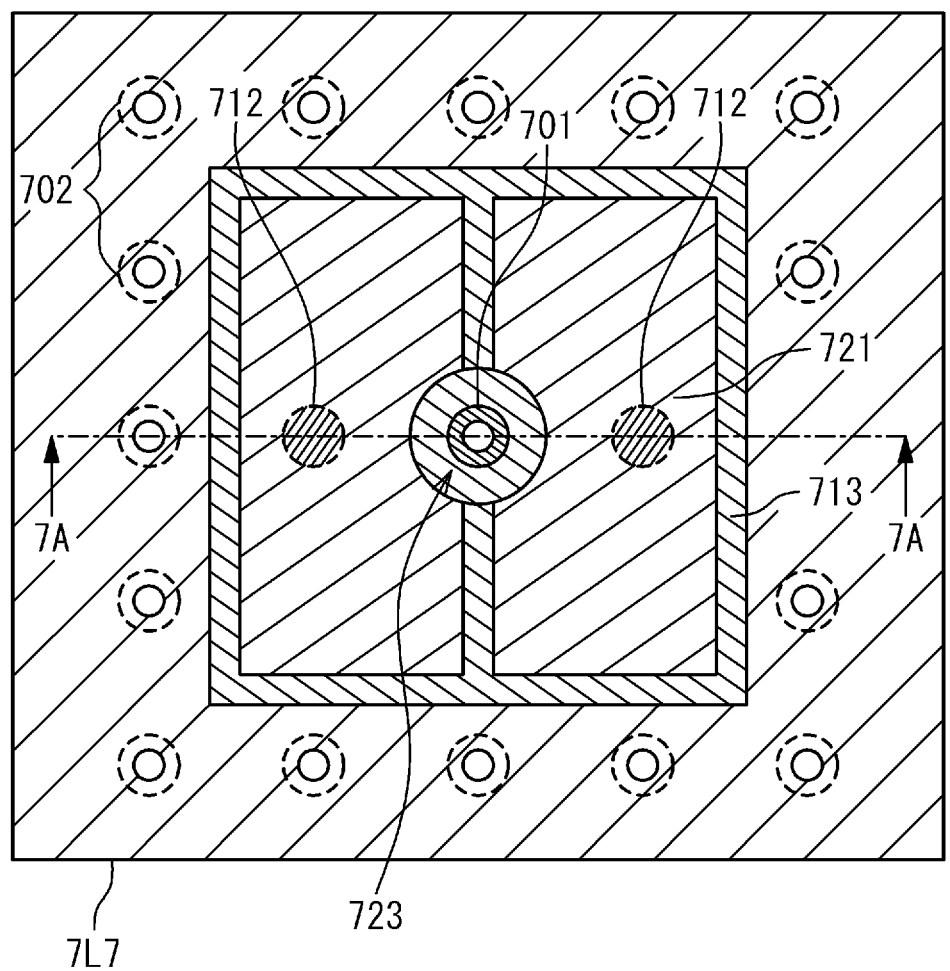
FIG. 7G is a horizontal cross-sectional view of the via structure shown in FIG. 7A on the 7G section.
Figure 7H:
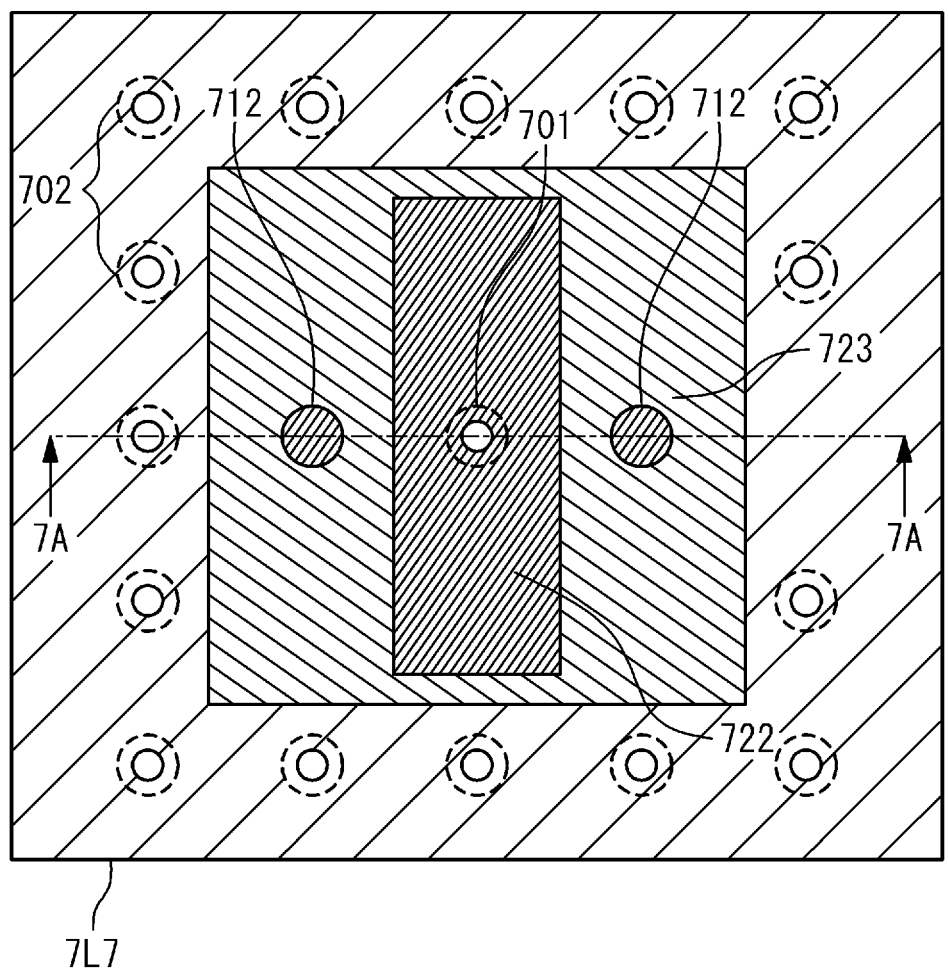
FIG. 7H is a horizontal cross-sectional view of the via structure shown in FIG. 7A on the 7H section.
Figure 7I:
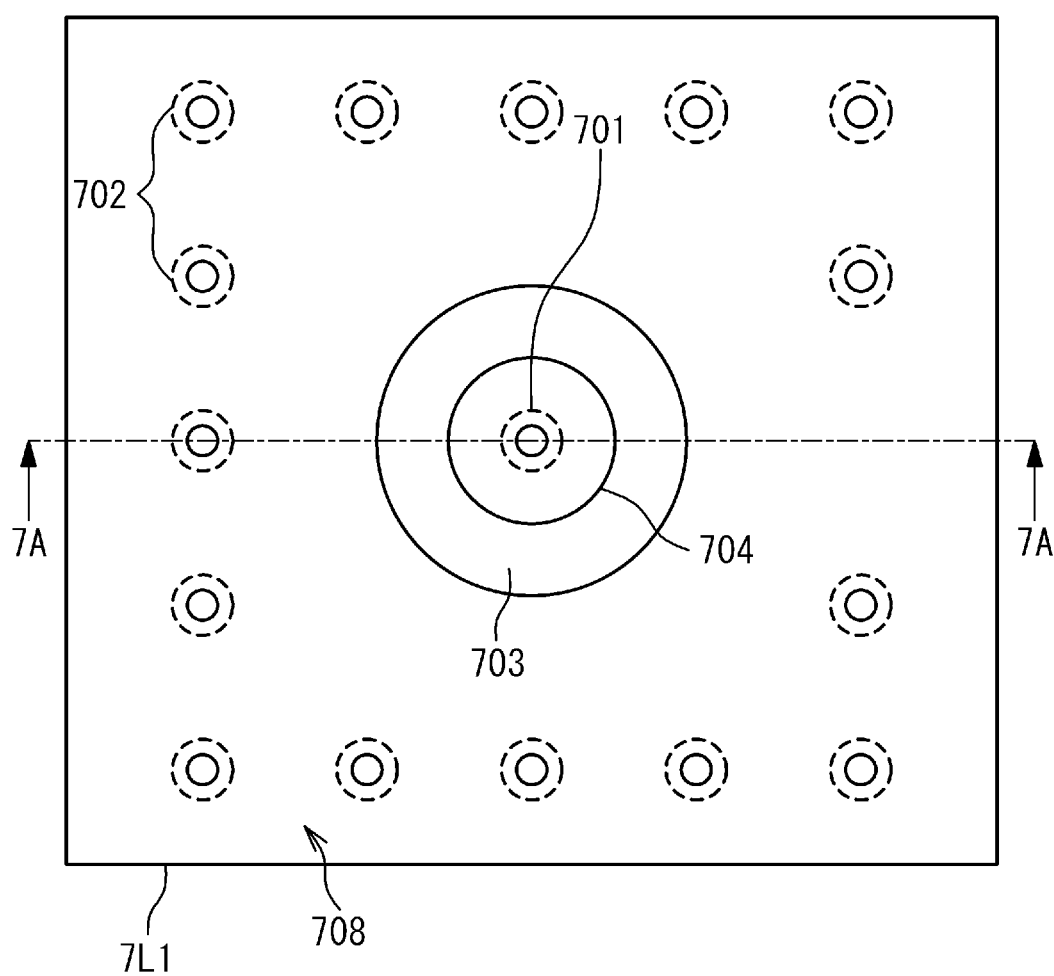
FIG. 7I is a top view of the via structure shown in FIG. 7A.
Figure 7J:
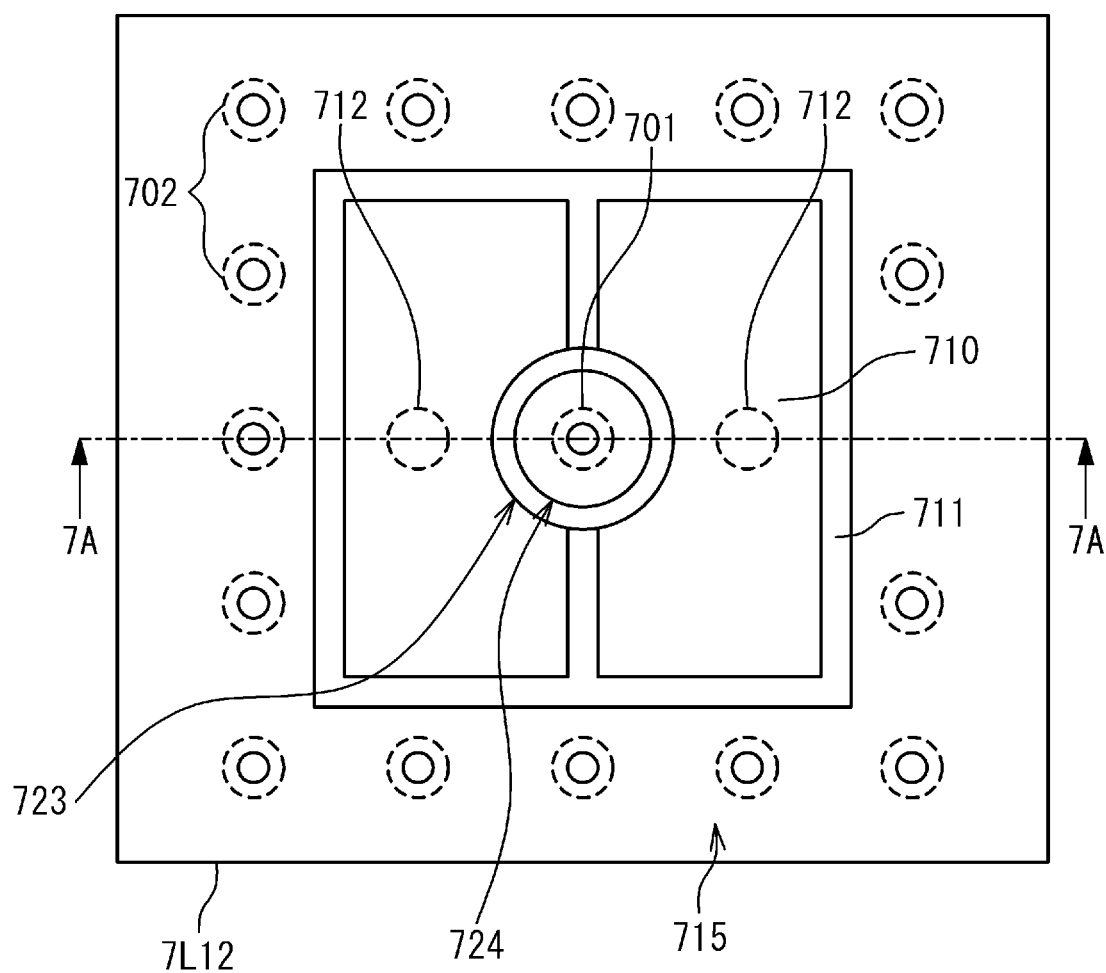
FIG. 7J is a bottom view of the via structure shown in FIG. 7A.

In FIG. 6, magnitudes of return ($|S_{11}|$-parameter) and insertion ($|S_{12}|$-parameter) losses for the relating art filter shown in FIGS. 5A to 5D are presented.

As one can see in this figure, there is no transmission zero which appears in FIG. 4. And as a result, the resonance with the central frequency of about 12.5 GHz is excited in the out-of-band area. This resonance leads to forming the pass band at the frequencies between about 12 GHz and 13 GHz. This effect can be unwanted in a number of applications where noise suppression has to be in a wide frequency area.

That is why application of the via structures of the present invention and filters formed by these structures can overcome this problem.

Moreover, it should be noted that transverse dimensions of the filters of the present invention and substrates used to form these filters are the same as in relating art structures. Particularly, it means that advantageous properties of the invented structures are obtained in a cost-effective manner.

It should be well understandable that other types of filters like stopband and passband ones can be obtained by the use of via structures of the present invention.

Also, a different number of via structures, including forming a periodic configuration, can be used to design a filtering component.

Moreover, through-hole, blind, counter-bored, buried and other vias can be used to form the via structures of the present invention.

As an exemplary embodiment, a via structure in a twelve-conductor-layer substrate is shown in FIGS. 7A to 7J.

The via structure shown in FIGS. 7A to 7J is provided with stacked conductor layers 7L1, 7L2, 7L3, 7L4, 7L5, 7L6, 7L7, 7L8, 7L9, 7L10, 7L11 and 7L12, and those twelve conductor layers are isolated by a dielectric 716.

In present embodiment, the via structure has three functional sections.

The first functional section includes a first pad 704, a connection pad 717, a first segment of a signal via 701, ground vias 702, ground plates 708 and a clearance area 703. The first pad 704 is disposed on one side of the substrate. The first segment of a signal via 701 is connected to the first pad 704 in one hand and connection pad 717 in the other hand. The ground vias 702 are surrounding the signal via 701. The ground plates 708 are connected to the ground vias 702. The clearance area 703 is isolating the first pad 704, the connection pad 717 and the first segment of the signal via 701 from ground conductors. In this functional section the first pad 704 and the connection pad 717 are used as input or output ports of a signal. The clearance area 703 can be considered as a first clearance region embedded in the dielectric 716. The first pad 704 and the ground plates 708 are embedded in the conductor layers.

The second functional section has a second segment of the signal via 101, ground vias 702, ground plates 705, conductive plate 707, an isolating slit 706 and 720, a connection plate 719 and a clearance area 718. The second segment of the signal via 101 is jointed to the connection pad 717. The ground plates 705 are connected to the ground vias 702. The conductive plate 707 is connected to the second segment of the signal via 701. The isolating slit 706 is separating the conductive plate 707 from ground conductors. The connection plate 719 is jointed to the second segment of the signal via 701. The isolating slit 720 is separating the connection plate 719 from ground conductors. The clearance area 718 is separating the second segment of the signal via 701 from ground conductors. The isolating slits 706 and 720 and the clearance area 718 can be considered as a second clearance region embedded in the dielectric 716. The ground plates 705, the conductive plate 707 and the connection plate 719 are embedded in the conductor layers.

The third functional section includes a third segment of the signal via 701, two identical side signal vias 712, ground vias 702, ground plates 714, two sets of conductive plates 721, isolating slits 713 and 711, conductive plates 722, two border plates 710, a border plate 724 and a clearance area 723. The two side signal vias 712 are jointed to the connection plate 719. The ground vias 702 are surrounding the third segment of the signal via 701 and two side signal vias 712. The ground plates 714 are connected to ground vias 702. One of the two sets of conductive plates 721 is connected to one side signal via 712 and another set is connected to another side signal via 712. The isolating slit 713 is separating the two sets of conductive plates 721 from each other and from ground conductors. The conductive plates 722 are connected to the third segment of the signal via 701. The two border plates 710 are disposed on another side of the substrate in which each border plate is connected respectively to each side signal via 712. The isolating slit 711 is separating two border plates 710 from each other and from ground conductors disposed on the same conductor layer. The border plate 724 is connected to the third segment of the signal via 701. The clearance area 723 is isolating the third segment of the signal via 701, the conductive plates 722 and the border plate 724 from ground conductors. The isolating slits 713 and 711 and the clearance area 723 can be considered as a third clearance region embedded in the dielectric 716. The ground plates 714, the two sets of conductive plates 721, the conductive plates 722, the two border plates 710 and the border plate 724 are embedded in the conductor layers.

It should be noted that in this via structure, the signal via 701 and ground vias 702 can be fabricated as through hole vias, while side signal vias 712 can be fabricated using blind (micro) via technologies.

While the present invention has been described in relation to some exemplary embodiments, it is to be understood that these exemplary embodiments are for the purpose of description by example, and not of limitation. While it will be obvious to those skilled in the art upon reading the present specification that various changes and substitutions may be easily made by equal components and art, it is obvious that such changes and substitutions lie within the true scope and spirit of the presented invention as defined by the claims. Above mentioned exemplary embodiments can be mixed in a limit of technical contradiction.

The invention claimed is:

1. A filter, comprising:
    a plurality of via structures;
    a transmission line configured to connect said plurality of via structures; and
    a plurality of signal ports configured to input or output signals,
    wherein each of said plurality of via structures comprises:
        a multilayer substrate with a plurality of stacked conductor layers and a dielectric isolating each of said plurality of stacked conductor layers;
        a first functional section disposed at one side of said multilayer substrate;
        a second functional section connected to said first functional section; and
        a third functional section connected to said second functional section and disposed at another side of said multilayer substrate opposite to said side of said first functional section, wherein said first functional section comprises:
  a first pad embedded in a top conductor layer of said plurality of stacked conductor layers;
  a connection pad embedded in one of said plurality of conductor layers and configured to connect to said second functional section;
  a first signal via with one end connected to said first pad and another end connected to said connection pad;
  a first plurality of ground vias surrounding said first signal via;
  a first plurality of ground plates embedded in said plurality of conductor layers and connected to said first plurality of ground vias; and
  a first clearance region embedded in said dielectric configured to isolate said first pad, said connection pad and said first signal via from said first plurality of ground vias and said first plurality of ground plates,
wherein said second functional section comprises:
  a connection plate embedded in one of said plurality of conductor layers and configured to connect to said third functional section;
  a second signal via with one end connected to said connection pad and another end connected to said connection plate;
  a second plurality of ground vias surrounding said second signal via;
  a second plurality of ground planes embedded in said plurality of conductor layers and connected to said second plurality of ground vias; and
  a second clearance region embedded in said dielectric and configured to isolate said connection plate and said second signal via from said second plurality of ground vias and said second plurality of ground planes,
wherein said third functional section comprises two blocks which are formed by:
  two identical third signal vias connected to said connection plate by one end;
  two identical sets of conductive plates respectively connected to said two identical third signal vias;
  a third plurality of ground vias surrounding said two identical third signal vias;
  a third plurality of ground planes connected to said third plurality of ground vias; and
  a third clearance region embedded in said dielectric and configured to isolate said two identical third signal vias and said two identical sets of conductive plates from said third plurality of ground vias and said third plurality of ground planes,
wherein said transmission line is connected to said connection pad of said each via structure, wherein said plurality of signal ports are connected to or embedded in said first pad of each of said plurality of via structures, and
wherein the third clearance region isolates said two identical sets of conductive plates from each other.

2. A filter, comprising:
a plurality of via structures;
a transmission line configured to connect said plurality of via structures; and
a plurality of signal ports configured to input or output signals,
wherein each of said plurality of via structures comprises:
  a multilayer substrate with a plurality of stacked conductor layers and a dielectric isolating each of said plurality of stacked conductor layers;
  a first functional section disposed at one side of said multilayer substrate;
  a second functional section connected to said first functional section; and
  a third functional section connected to said second functional section and disposed at another side of said multilayer substrate opposite to said side of said first functional section,
wherein said first functional section comprises:
  a first pad embedded in a top conductor layer of said plurality of stacked conductor layers;
  a connection pad embedded in one of said plurality of conductor layers and configured to connect to said second functional section;
  a first signal via with one end connected to said first pad and another end connected to said connection pad;
  a first plurality of ground vias surrounding said first signal via;
  a first plurality of ground plates embedded in said plurality of conductor layers and connected to said first plurality of ground vias; and
  a first clearance region embedded in said dielectric configured to isolate said first pad, said connection pad and said first signal via from said first plurality of ground vias and said first plurality of ground plates,
wherein said second functional section comprises:
  a connection plate embedded in one of said plurality of conductor layers and configured to connect to said third functional section;
  a second signal via with one end connected to said connection pad and another end connected to said connection plate;
  a second plurality of ground vias surrounding said second signal via;
  a second plurality of ground planes embedded in said plurality of conductor layers and connected to said second plurality of ground vias; and
  a second clearance region embedded in said dielectric and configured to isolate said connection plate and said second signal via from said second plurality of ground vias and said second plurality of ground planes,
wherein said third functional section comprises two blocks which are formed by:
  two identical third signal vias connected to said connection plate by one end;
  two identical sets of conductive plates respectively connected to said two identical third signal vias;
  a third plurality of ground vias surrounding said two identical third signal vias;
  a third plurality of ground planes connected to said third plurality of ground vias; and
  a third clearance region embedded in said dielectric and configured to isolate said two identical third signal vias and said two identical sets of conductive plates from said third plurality of ground vias and said third plurality of ground planes,
wherein said transmission line is connected to said connection pad of said each via structure, wherein said plurality of signal ports are connected to or embedded in said first pad of each of said plurality of via structures, and
wherein said two identical sets of conductive plates are isolated from each other.

3. The filter according to claim 2, wherein said second clearance region comprises an isolating slit configured to isolate said connection plate from one of said second plurality of ground plates which is disposed in a same layer of said multilayer substrate, wherein said third clearance region comprises an isolating slit configured to isolate each conductive plate of said two identical sets of conductive plates and each of said third plurality of ground planes disposed in a same layer of said multilayer substrate.

4. The filter according to claim 3, wherein said third functional section further comprises: two identical border plates embedded in a last layer of said plurality of stacked conductor layers and connected to said two identical third signal vias respectively by another end; and an isolating slit isolating said two identical border plates from one of said plurality of third ground planes which is disposed in a same layer of said multilayer substrate.

5. One of the plurality of via structures according to claim 4.

6. The filter according to claim 4, wherein said second functional section further comprises a plurality of conductive plates connected to said second via and isolated from said second plurality of ground vias and said second plurality of ground planes by said second clearance region.

7. One of the plurality of via structures according to claim 6.

8. The filter according to claim 3, wherein said two identical third signal vias are connected by another end to one of said plurality of third ground planes disposed in a last layer of said plurality of stacked conductor layers.

9. One of the plurality of via structures according to claim 8.

10. The filter according to claim 8, wherein said second functional section further comprises a plurality of conductive plates connected to said second via and isolated from said second plurality of ground vias and said second plurality of ground planes by said second clearance region.

11. One of the plurality of via structures according to claim 10.

12. One of the plurality of via structures according to claim 3.

13. The filter according to claim 2, wherein said second functional section comprises a single block connected to said two blocks of said third functional section.

14. The filter according to claim 13, wherein said first functional section comprises a single block connected to said single block of said second functional section.

15. The filter according to claim 14, wherein one of the plurality of signal ports is coupled to the single block of said first functional section, and another one of the plurality of signal ports is coupled to the single block of said first functional section and the single block of said second functional section.

16. The filter according to claim 2, wherein said second functional section comprises only a single block connected to said two blocks of said third functional section.

17. The filter according to claim 16, wherein said first functional section comprises only a single block connected to the single block of said second functional section.

18. The filter according to claim 17, wherein one of the plurality of signal ports is coupled to the single block of said first functional section, and another one of the plurality of signal ports is coupled to the single block of said first functional section and the single block of said second functional section.

* * * * *